United States Patent
Yuan et al.

(10) Patent No.: US 8,271,821 B2
(45) Date of Patent: *Sep. 18, 2012

(54) FLEXIBLE RAM CLOCK ENABLE

(75) Inventors: Jinyong Yuan, Cupertino, CA (US); Christopher F. Lane, San Jose, CA (US); David E. Jefferson, Morgan Hill, CA (US); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 893 days.

This patent is subject to a terminal disclaimer.

(21) Appl. No.: 12/145,440

(22) Filed: Jun. 24, 2008

(65) Prior Publication Data

US 2008/0253220 A1    Oct. 16, 2008

Related U.S. Application Data

(63) Continuation of application No. 11/399,771, filed on Apr. 7, 2006, now Pat. No. 7,397,726.

(51) Int. Cl.
*G06F 1/04* (2006.01)
*G06F 1/12* (2006.01)

(52) U.S. Cl. ........ 713/400; 713/401; 713/500; 713/600; 365/233

(58) Field of Classification Search .................. 713/400, 713/401, 500, 600; 365/233
See application file for complete search history.

(56) References Cited

U.S. PATENT DOCUMENTS

| | | | |
|---|---|---|---|
| 7,263,457 B2 * | 8/2007 | White et al. | 702/132 |
| 7,397,726 B1 * | 7/2008 | Yuan et al. | 365/233.19 |
| 2005/0114560 A1 * | 5/2005 | Coleman et al. | 710/22 |
| 2007/0162630 A1 * | 7/2007 | Tang | 710/14 |
| 2007/0201297 A1 * | 8/2007 | Kim | 365/230.05 |

* cited by examiner

*Primary Examiner* — Kim Huynh
*Assistant Examiner* — Michael J Brown
(74) *Attorney, Agent, or Firm* — Womble Carlyle Sandridge & Rice, LLP

(57) ABSTRACT

A first set of configuration logic is configurable to provide a first port input clock signal for controlling input registers of a first port of a memory block. A second set of configuration logic is configurable to provide a second port input clock signal for controlling input registers of a second port of the memory block.

16 Claims, 15 Drawing Sheets

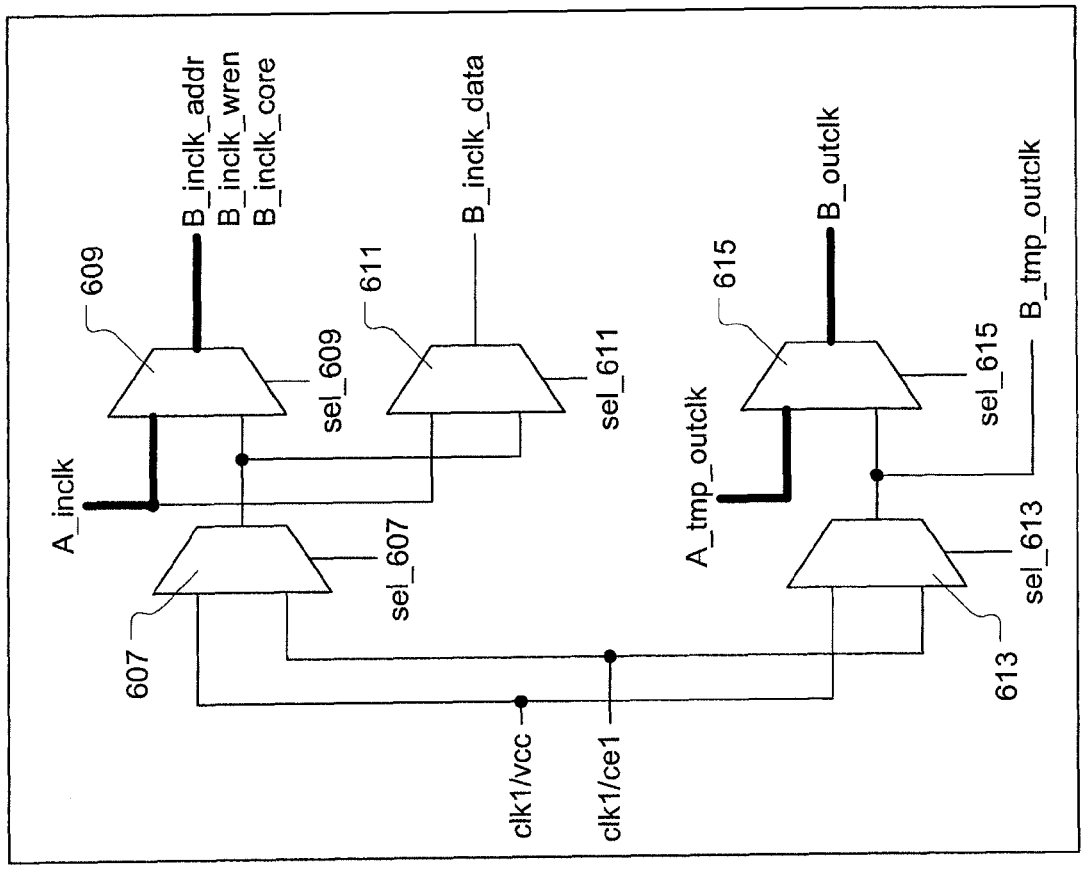
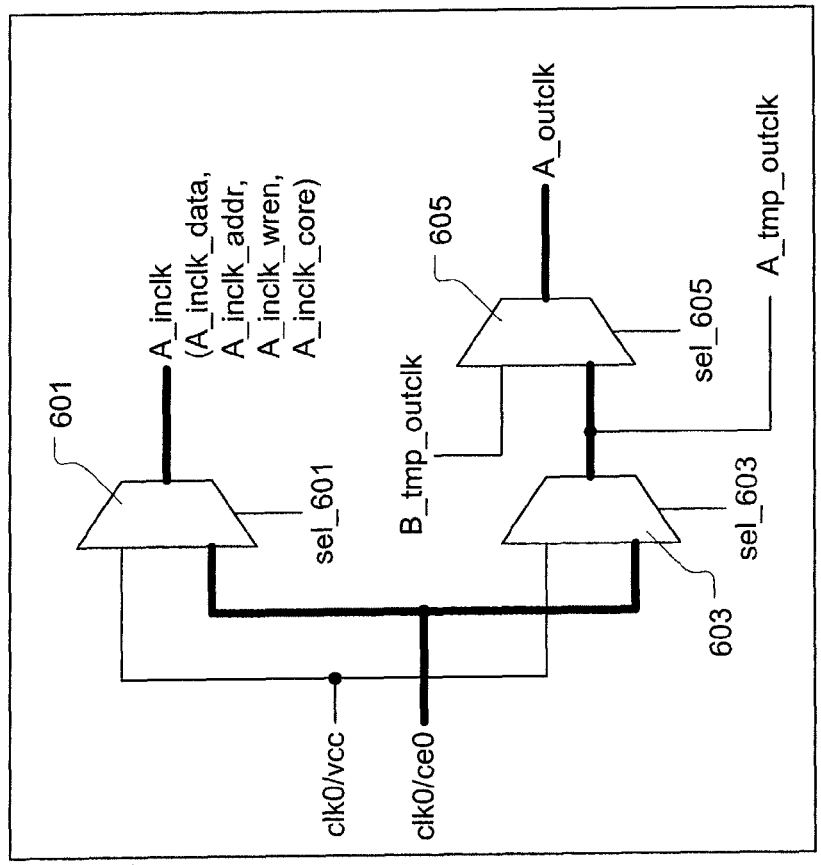
Fig. 9B
Fig. 9A

FLEXIBLE RAM CLOCK ENABLE

CLAIM OF PRIORITY

This application is a continuation of prior application Ser. No. 11/399,771, filed on Apr. 7, 2006 now U.S. Pat. No. 7,397,726, the disclosure of which is incorporated herein by reference in its entirety.

BACKGROUND

Programmable logic devices (PLDs) such as field programmable gate arrays (FPGAs) include configurable logic blocks and memory blocks. As will be appreciated by those skilled in the art, the FPGA architecture can be configured by appropriately setting configuration bits. In general, the configuration bits control connections between available routings within the FPGA. By appropriately setting a particular combination of configuration bits, the programmable architecture of the FPGA can be connected, i.e., programmed, to provide a particular functionality. It should be appreciated that by setting different, yet appropriate, combinations of the configuration bits, the FPGA can be connected to provide different functionality. Hence, in some FPGA architectures, the configurable memory blocks can be configured into a number of different memory types and sizes. A FPGA programmer can select the particular memory type and size that best suits the needs of the system to be defined on the FPGA. Therefore, it is desirable to provide an FPGA architecture that supports a broad spectrum of memory block configuration options.

SUMMARY

In one embodiment, clock configuration logic for a memory block is disclosed. The clock configuration logic includes a first set of clock configuration logic that is configurable to provide a first port input clock signal for controlling input registers of a first port of the memory block. The clock configuration logic also includes a second set of clock configuration logic that is configurable to provide a second port input clock signal for controlling input registers of a second port of the memory block.

In another embodiment, a method is disclosed for controlling a memory block. The method includes an operation for using a first port input clock signal to control both input registers of a first port of the memory block and a core of the memory block, during processing of instructions received through the first port The method also includes an operation for using a second port input clock signal to control input registers of a second port of the memory block.

In another embodiment, clock configuration logic for a memory block is disclosed. The clock configuration logic includes a first set of clock configuration logic that is configurable to provide a first port input clock signal for controlling input registers of a first port of the memory block. The first set of clock configuration logic is also configurable to provide a first port core clock signal for controlling a core of the memory block. The first port core clock signal can be controlled independently from the first port input clock signal.

In another embodiment, a method is disclosed for configuring clock signals to control a memory block. The method includes an operation for selecting a first port input clock signal from a group consisting of a first clock signal, the first clock signal tied to a first clock enable signal, and the first clock signal tied to a second clock enable signal. The method also includes an operation for using the first port input clock signal to control input registers of a first port of the memory block.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 9A-9B are illustrations showing the configuration logic connectivity for configuring the clocking of Ports A and B when the memory block is configured to operate in SDP mode and single clock mode, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
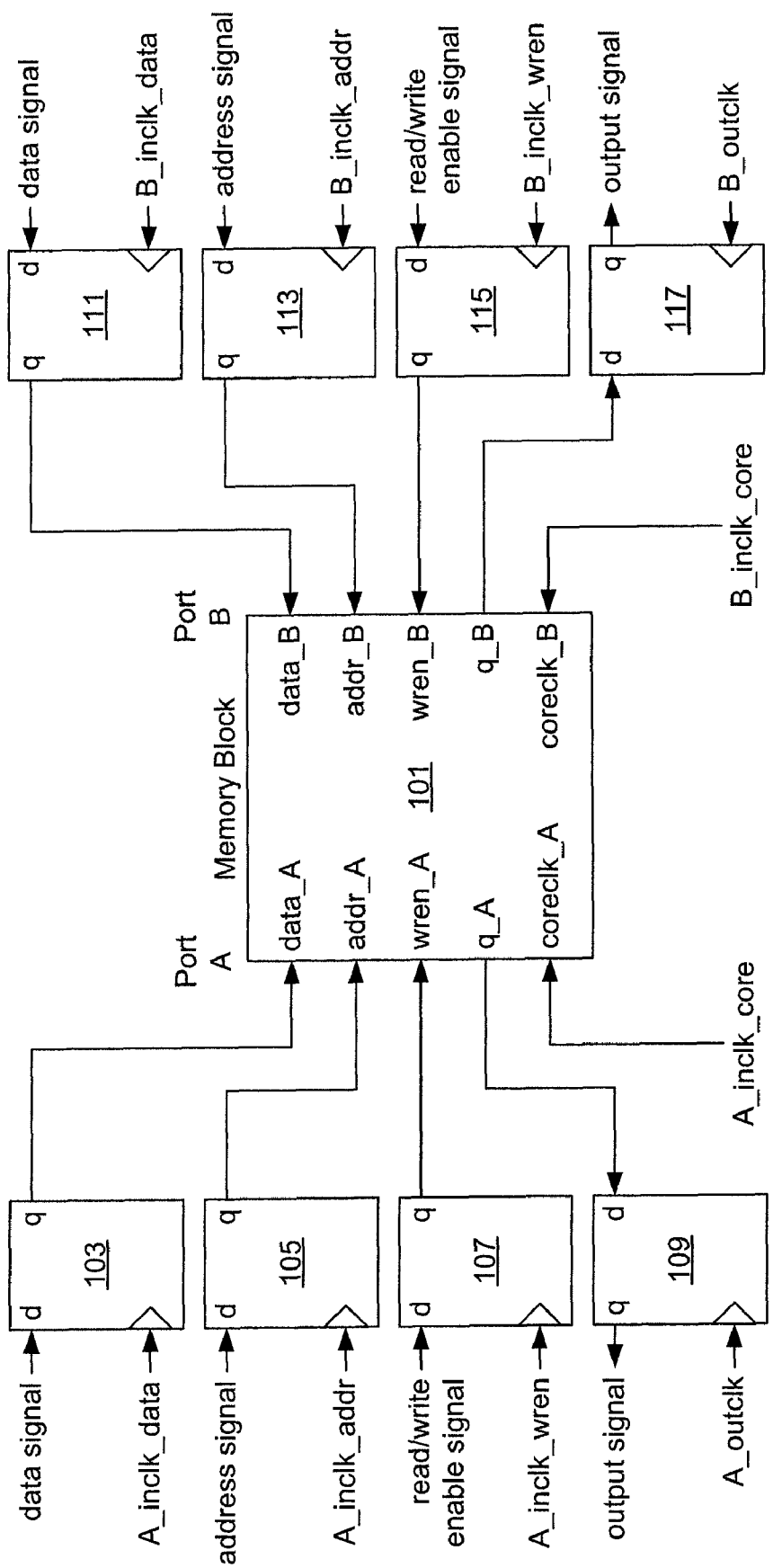
FIG. 1 is an illustration showing a configurable memory block architecture of an exemplary FPGA, in accordance with one embodiment of the present invention.

FIG. 1 is an illustration showing a configurable memory block architecture of an exemplary FPGA, in accordance with one embodiment of the present invention. The memory block 101 includes two ports, namely Port A and Port B. In the embodiment of FIG. 1, Port A includes a data input connection (data_A), an address input connection (addr_A), a read/write enable input connection (wren_A), a data output connection (q_A), and a memory core clock input connection (coreclk_A). In the embodiment of FIG. 1, Port B includes a data input connection (data_B), an address input connection (addr_B), a read/write enable input connection (wren_B), a data output connection (q_B), and a memory core clock input connection (coreclk_B). It should be appreciated that in other embodiments each of Port A and Port B can include additional input and/or output connections. However, to avoid unnecessarily obscuring the description of the present invention, the discussion herein will be limited to the exemplary configurable memory block 101, including the Port A and Port B input and output connections identified in the embodiment of FIG. 1.

The input and output connections (other than the memory core clock input connections) on each of Port A and Port B of the configurable memory block 101 are registered. Specifically, the data input connection (data_A) is registered by flip-flop 103, the address input connection (addr_A) is registered by flip-flop 105, the read/write enable input connection (wren_A) is registered by flip-flop 107, the data output connection (q_A) is registered by flip-flop 109. The data input connection (data_B) is registered by flip-flop 111, the address input connection (addr_B) is registered by flip-flop 113, the read/write enable input connection (wren_B) is registered by flip-flop 115, the data output connection (q_B) is registered by flip-flop 117.

The flip-flop 103 is configured to receive and latch a data signal in accordance with a clock signal (A_inclk_data), and provide the latched data signal to the data input connection (data_A) of Port A in accordance with the clock signal (A_inclk_data). The flip-flop 105 is configured to receive and latch an address signal in accordance with a clock signal (A_inclk_addr), and provide the latched address signal to the address input connection (addr_A) of Port A in accordance with the clock signal (A_inclk_addr). The flip-flop 107 is configured to receive and latch a read/write enable signal in accordance with a clock signal (A_inclk_wren), and provide the latched read/write enable signal to the read/write enable input connection (wren_A) of Port A in accordance with the clock signal (A_inclk_wren). The flip-flop 109 is configured to receive and latch an output data signal from the data output connection (q_A) of Port A in accordance with a clock signal (A_outclk), and provide the latched output data signal to the requesting FPGA logic in accordance with the clock signal (A_outclk).

The flip-flop 111 is configured to receive and latch a data signal in accordance with a clock signal (B_inclk_data), and provide the latched data signal to the data input connection (data_B) of Port B in accordance with the clock signal (B_inclk_data). The flip-flop 113 is configured to receive and latch an address signal in accordance with a clock signal (B_inclk_addr), and provide the latched address signal to the address input connection (addr_B) of Port B in accordance with the clock signal (B_inclk_addr). The flip-flop 115 is configured to receive and latch a read/write enable signal in accordance with a clock signal (B_inclk_wren), and provide the latched read/write enable signal to the read/write enable input connection (wren_B) of Port B in accordance with the clock signal (B_inclk_wren). The flip-flop 117 is configured to receive and latch an output data signal from the data output connection (q_B) of Port B in accordance with a clock signal (B_outclk), and provide the latched output data signal to the requesting FPGA logic in accordance with the clock signal (B_outclk).

It should be appreciated that through the setting of configuration bits, the memory block 101 can be configured to operate in one of several different types of memory modes. Depending on the configuration of the memory block 101, as established by the configuration bit settings, some of the input and output connections of the memory block may effectively be disconnected. FIGS. 2-5 show examples of how the memory block 101 can be configured to operate in different types of memory modes. It should be appreciated that the various types of memory modes illustrated in FIGS. 2-5 are not intended to represent an inclusive set of memory modes in which the memory block 101 can be configured to operate. In other embodiments, the memory block 101 can be configured to operate in memory modes that are not discussed herein in the interest of clarity.

Figure 2:
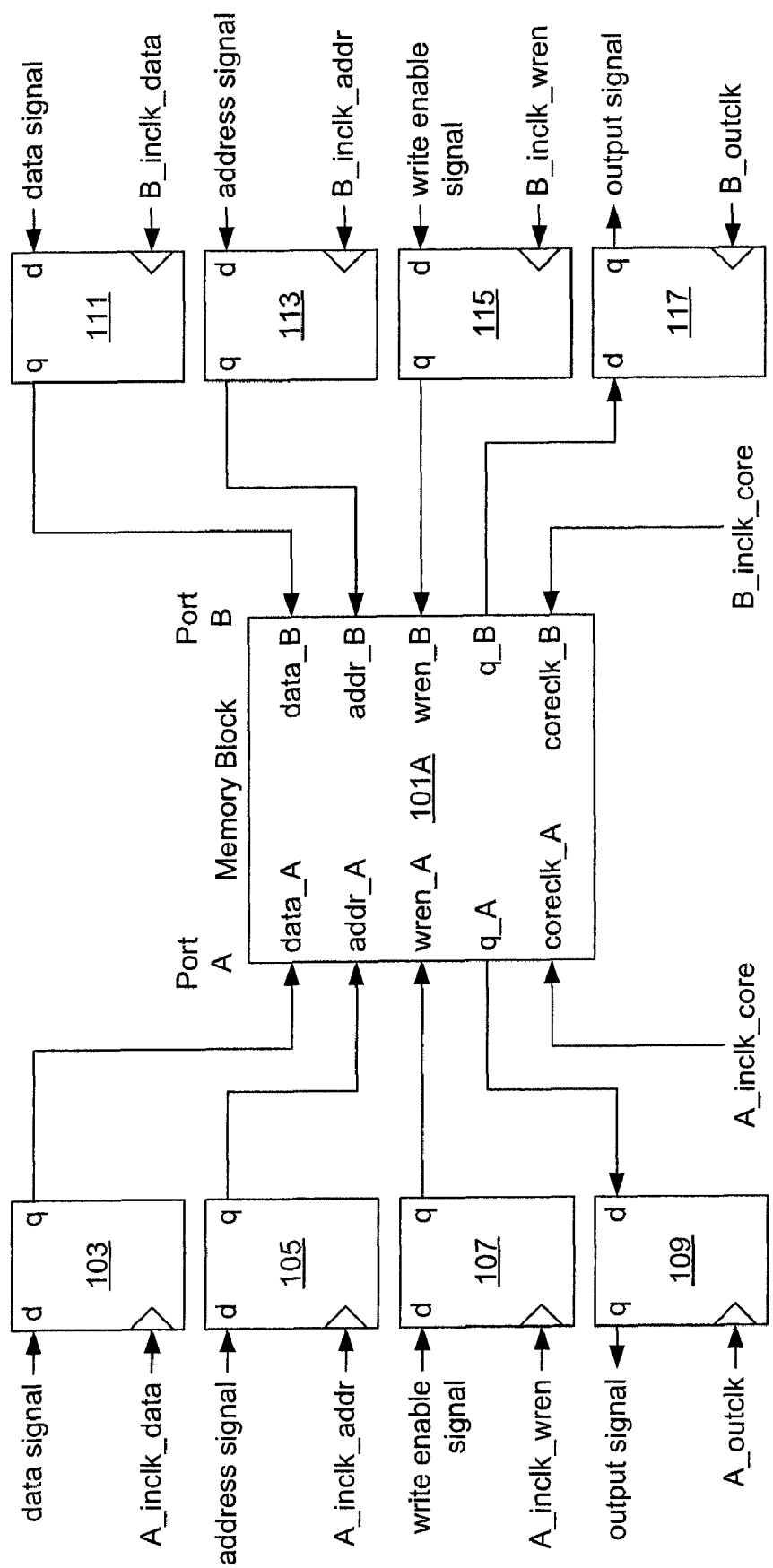
FIG. 2 is an illustration showing the memory block configured to operate in a true dual port (TDP) mode, in accordance with one embodiment of the present invention.

FIG. 2 is an illustration showing the memory block 101 configured to operate in a true dual port (TDP) mode, in accordance with one embodiment of the present invention. The memory block 101 configured to operate in TDP mode is identified as memory block 101A. In TDP mode, Port A is connected to operate as the first of the two ports, and Port B is connected to operate as the second of the two ports. In TDP mode, each of Port A and Port B can be used to access a shared memory core within the memory block 101A. TDP mode supports any combination of simultaneous two-port operations, including two read operations, two write operations, or one read operation and one write operation at two different clock frequencies.

In TDP mode, if Port A is used to perform a write operation, data to be written to the memory block 101A arrives at the data input connection (data_A) after being registered through the flip-flop 103, in accordance with the clock signal (A_inclk_data). The address to which the data is to be written arrives at the address input connection (addr_A) after being registered through the flip-flop 105, in accordance with the clock signal (A_inclk_addr). In TDP mode, the read/write enable input connection (wren_A) is connected to receive a write enable signal. Thus, the read/write enable input connection (wren_A) is actually a write enable input connection (wren_A). In one embodiment, the write enable signal arrives at the write enable input connection (wren_A) after being registered through the flip-flop 107, in accordance with the clock signal (A_inclk_wren). In one embodiment, a high signal is used to indicate the enabling of a write operation, i.e., that a write operation can be performed.

In TDP mode, if Port A is used to perform a read operation, the address from which data is to be read arrives at the address input connection (addr_A) after being registered through the flip-flop 105, in accordance with the clock signal (A_inclk_addr). The data read from the memory block 101A is transmitted from the data output connection (q_A) through the flip-flop 109, in accordance with the clock signal (A_outclk). It should be appreciated that the clock signal (A_inclk_core) is used to synchronize operations within the core of the memory block 101A, as necessary to satisfy memory access requests received through Port A.

In TDP mode, if Port B is used to perform a write operation, data to be written to the memory block 101A arrives at the data input connection (data_B) after being registered through the flip-flop 111, in accordance with the clock signal (B_inclk_data). The address to which the data is to be written arrives at the address input connection (addr_B) after being registered through the flip-flop 113, in accordance with the clock signal (B_inclk_addr). In TDP mode, the read/write enable input connection (wren_B) is connected to receive a write enable signal. Thus, the read/write enable input connection (wren_B) is actually a write enable input connection (wren_B). In one embodiment, the write enable signal arrives at the write enable input connection (wren_B) after being registered through the flip-flop 115, in accordance with the clock signal (B_inclk_wren). In one embodiment, a high signal is used to indicate the enabling of a write operation, i.e., that a write operation can be performed.

In TDP mode, if Port B is used to perform a read operation, the address from which data is to be read arrives at the address input connection (addr_B) after being registered through the flip-flop 113, in accordance with the clock signal (B_inclk_addr). The data read from the memory block 101A is transmitted from the data output connection (q_B) through the flip-flop 117, in accordance with the clock signal (B_outclk). It should be appreciated that the clock signal (B_inclk_core) is used to synchronize operations within the core of the memory block 101A, as necessary to satisfy memory access requests received through Port B.

Given the above-described TDP mode configuration of the memory block 101A, it should be appreciated that operation of the memory block 101A is dependent on the particular provision of the various clock signals, including A_inclk_data, A_inclk_addr, A_inclk_wren, A_outclk, A_inclk_core, B_inclk_data, B_inclk_addr, B_inclk_wren, B_outclk, and B_inclk_core. The memory block 101A in TDP mode can be configured to operate in various clock modes.

In one embodiment, the memory block 101A in TDP mode can be configured to operation in an independent clock mode. In independent clock mode, a separate clock is available for each port, i.e., Port A and Port B. Specifically, a first clock signal (clk0) is used to control all registers on the Port A side of the memory block 101A. Therefore, the clock signals A_inclk_data, A_inclk_addr, A_inclk_wren, A_outclk, and A_inclk_core correspond to the first clock signal (clk0). A second clock signal (clk1) is used to control all registers on the Port B side of the memory block 101A. Therefore, the clock signals B_inclk_data, B_inclk_addr, B_inclk_wren, B_outclk, and B_inclk_core correspond to the second clock signal (clk1).

Additionally, independent clock mode supports independent clock enables for Port A and Port B, respectively. Thus, the first clock signal (clk0) has an associated clock enable signal (ce0). Similarly, the second clock signal (clk1) has an associated clock enable signal (ce1). The clock enable signals (ce0) and (ce1) serve to effectively shut off their associated clocks. For instance, clock enable signal (ce0) can be used to enable the first clock signal (clk0) or disable the first clock signal (clk0). In one embodiment, if (ce0) is high, the first clock signal (clk0) is provided to service logic components connected thereto. If (ce0) is low, the first clock signal (clk0) is held low. Thus, when the clock enable signal (ce0) is held low, the logic components connected to receive the first clock signal (clk0) will be rendered inactive. In the same manner as described above for the clock enable signal (ce0), the clock enable signal (ce1) can be used to enable or disable the second clock signal (clk1).

In another embodiment, the memory block 101A in TDP mode can be configured to operate in an input/output clock mode. In input/output clock mode, a first clock signal (clk0) is used to control all the input registers on both Port A and Port B, and a second clock signal (clk1) is used to control the output registers on both Port A and Port B. Therefore, in input/output clock mode, the first clock signal (clk0) controls the flip-flops 103, 105, 107, 111, 113, and 115. The second clock signal (clk1) controls the flip-flops 109 and 117. As described above with respect to independent clock mode, each of the first clock signal (clk0) and the second clock signals (clk1) can be tied to a respective clock enable signal (ce0) and (ce1).

In another embodiment, the memory block 101A in TDP mode can be configured to operate in a single clock mode. In single clock mode, all registers of both Port A and Port B are controlled by a single common clock signal. Additionally, the single common clock signal can be tied to a clock enable signal.

Figure 3:
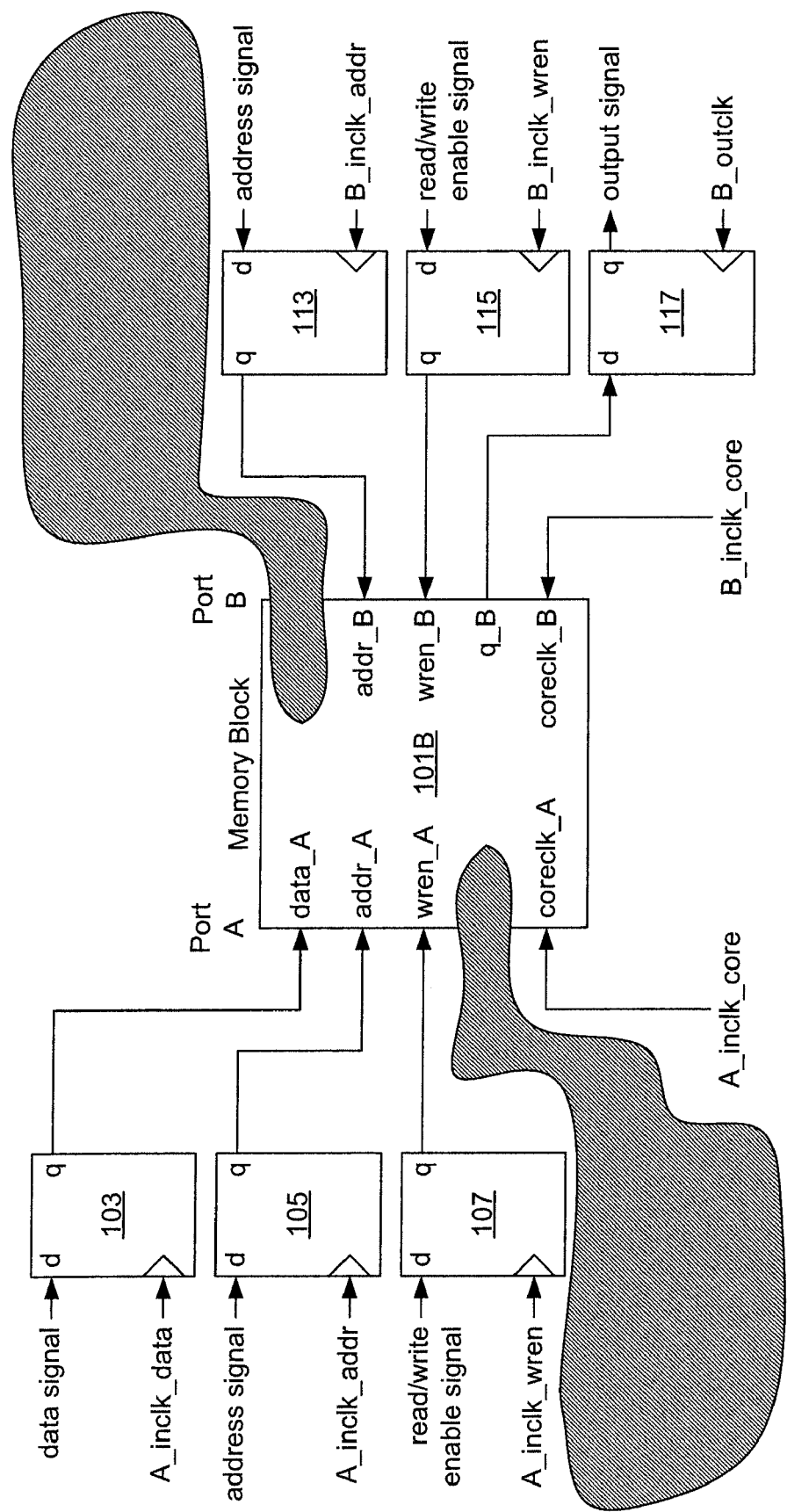
FIG. 3 is an illustration showing the memory block configured to operate in a simple dual port (SDP) mode, in accordance with one embodiment of the present invention.

FIG. 3 is an illustration showing the memory block 101 configured to operate in a simple dual port (SDP) mode, in accordance with one embodiment of the present invention. The memory block 101 configured to operate in SDP mode is identified as memory block 101B. In SDP mode, the memory block 101B is capable of supporting simultaneous read and write operations. More specifically, in SDP mode, Port A is connected to service write operations, and Port B is connected to service read operations. Thus, both Port A and Port B provide access a shared memory core within the memory block 101B. In SDP mode, the data output connection (q_A) on Port A is not used. Additionally, in SDP mode, the data input connection (data_B) on Port B is not used.

In SDP mode, data to be written to the memory block 101B arrives at the data input connection (data_A) after being registered through the flip-flop 103, in accordance with the clock signal (A_inclk_data). The address to which the data is to be written arrives at the address input connection (addr_A) after being registered through the flip-flop 105, in accordance with the clock signal (A_inclk_addr). In SDP mode, the read/write enable input connection (wren_A) is connected to receive a write enable signal. Thus, the read/write enable input connection (wren_A) is actually a write enable input connection (wren_A). The write enable signal arrives at the write enable input connection (wren_A) after being registered through the flip-flop 107, in accordance with the clock signal (A_inclk_wren). In one embodiment, a high signal is used to indicate the enabling of a write operation. It should be appreciated that the clock signal (A_inclk_core) is used to synchronize operations within the core of the memory block 101B, as necessary to satisfy memory write requests received through Port A.

In SDP mode, the address from which data is to be read arrives at the address input connection (addr_B) after being registered through the flip-flop 113, in accordance with the clock signal (B_inclk_addr). In SDP mode, the read/write enable input connection (wren_B) is connected to receive a read enable signal. Thus, the read/write enable input connection (wren_B) is actually a read enable input connection (wren_B). The read enable signal arrives at the read enable input connection (wren_B) after being registered through the flip-flop 115, in accordance with the clock signal (B_inclk_wren). In one embodiment, a high signal is used to indicate the enabling of a read operation. The data read from the memory block 101B is transmitted from the data output connection (q_B) through the flip-flop 117, in accordance with the clock signal (B_outclk). It should be appreciated that the clock signal (B_inclk_core) is used to synchronize operations within the core of the memory block 101B, as necessary to satisfy memory read requests received through Port B.

Given the above-described SDP mode configuration of the memory block 101B, it should be appreciated that operation of the memory block 101B is dependent on the particular provision of the various clock signals, including A_inclk_data, A_inclk_addr, A_inclk_wren, A_inclk_core, B_inclk_addr, B_inclk_wren, B_outclk, and B_inclk_core. The memory block 101B in SDP mode can be configured to operate in various clock modes, including a read/write clock mode, the input/output clock mode, and the single clock mode.

The input/output clock mode is the same as described above with respect to the memory block 101A configured to operate in TDP mode. Thus, for the memory block 101B in SDP mode and input/output clock mode, each of flip-flops 103, 105, 107, 113, and 115 is controlled by the first clock signal (clk0), i.e., an input clock signal, and the flip-flop 117 is controlled by the second clock signal (clk1), i.e., an output clock signal. Each of the input and output clock signals can be tied to a respective clock enable signal. For the memory block 101B in SDP mode and single clock mode, each of flip-flops 103, 105, 107, 113, 115, and 117 is controlled by a single common clock. The single common clock may be connected to a clock enable signal.

When the memory block 101B is configured to operate in SDP mode and read/write clock mode, a first clock signal (clk0), i.e., a write clock signal, is used to control the memory block 101B data input signals, the write address signals, and the write enable signals. Therefore, the clock signals A_inclk_data, A_inclk_addr, and A_inclk_wren correspond to the first clock signal (clk0). A second clock signal (clk1), i.e., a read clock signal, is used to control the memory block 101B data output signals, read address signals, and read enable signals. Therefore, the clock signals B_inclk_addr, B_inclk_wren, and B_outclk correspond to the second clock signal (clk1). Additionally, read/write clock mode supports independent clock enables for the first clock signal (clk0) and the second clock signal (clk1).

Figure 4:
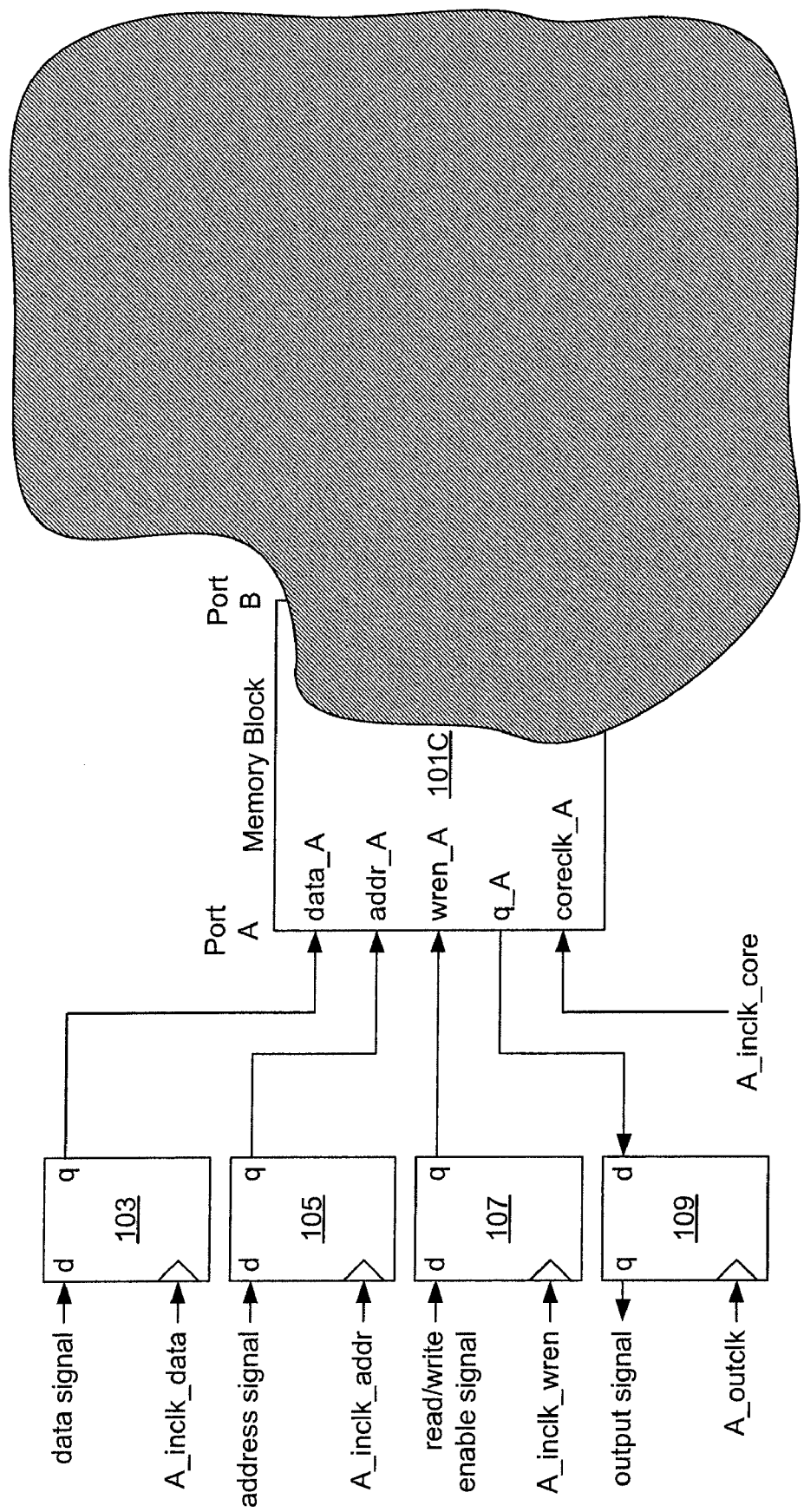
FIG. 4 is an illustration showing the memory block configured to operate in a single port (SP) mode, in accordance with one embodiment of the present invention.

FIG. 4 is an illustration showing the memory block 101 configured to operate in a single port (SP) mode, in accordance with one embodiment of the present invention. The memory block 101 configured to operate in SP mode is identified as memory block 101C. In SP mode, the memory block 101C supports non-simultaneous read and write operations. In SP mode, each of the data input connection (data_B), the address input connection (addr_b), the read/write enable input connection (wren_B), the data output connection (q_B), and the core clock signal (B_inclk_core) on Port B is not used.

In SP mode, data to be written to the memory block 101C arrives at the data input connection (data_A) after being registered through the flip-flop 103, in accordance with the clock signal (A_inclk_data). The address to which the data is to be written arrives at the address input connection (addr_A) after being registered through the flip-flop 105, in accordance with the clock signal (A_inclk_addr). In SP mode, the read/write enable input connection (wren_A) is connected to receive a write enable signal. Thus, the read/write enable input connection (wren_A) is actually a write enable input connection (wren_A). The write enable signal arrives at the write enable input connection (wren_A) after being registered through the flip-flop 107, in accordance with the clock signal (A_inclk_wren). In one embodiment, a high signal is used to indicate the enabling of a write operation.

In SP mode, the address from which data is to be read arrives at the address input connection (addr_A) after being registered through the flip-flop 105, in accordance with the clock signal (A_inclk_addr). The data read from the memory block 101C is transmitted from the data output connection (q_A) through the flip-flop 109, in accordance with the clock signal (A_outclk). It should be appreciated that the clock signal (A_inclk_core) is used to synchronize operations within the core of the memory block 101C.

Given the above-described SP mode configuration of the memory block 101C, it should be appreciated that operation of the memory block 101C is dependent on the particular provision of the various clock signals, including A_inclk_data, A_inclk_addr, A_inclk_wren, A_inclk_core, and A_outclk. The memory block 101C in SP mode can be configured to operate in various clock modes, including the input/output clock mode, and the single clock mode. For the memory block 101C in SP mode and input/output clock mode, each of flip-flops 103, 105, and 107 is controlled by the first clock signal (clk0), i.e., an input clock signal, and the flip-flop 109 is controlled by the second clock signal (clk1), i.e., an output clock signal. Each of the input and output clock signals can be tied to a respective clock enable signal. For the memory block 101C in SP mode and single clock mode, each of flip-flops 103, 105, 107, and 109 is controlled by a single common clock. The single common clock may be connected to a clock enable signal.

Figure 5:
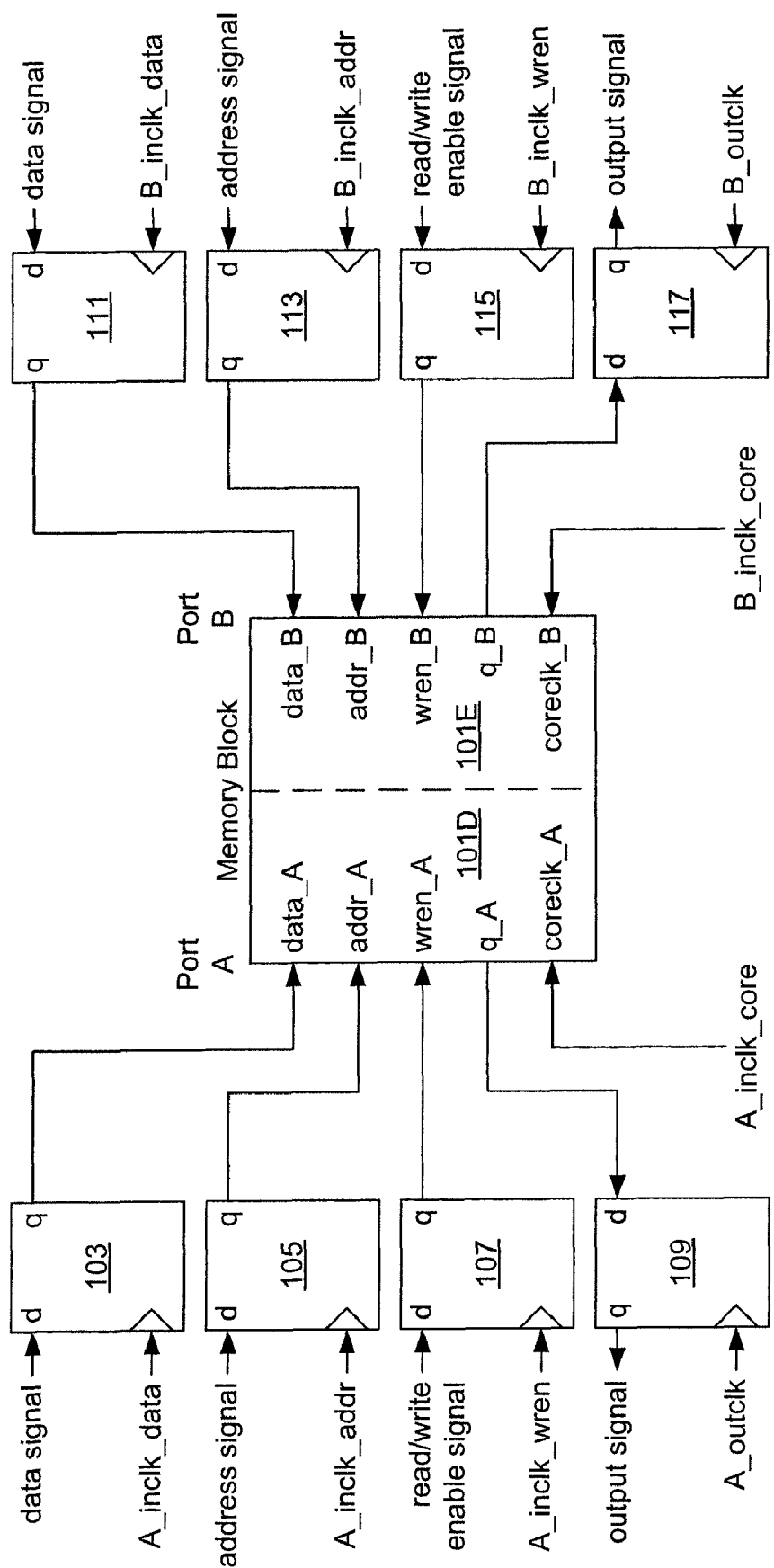
FIG. 5 is an illustration showing the memory block configured to operate in a pack mode, in accordance with one embodiment of the present invention.

FIG. 5 is an illustration showing the memory block 101 configured to operate in a pack mode, in accordance with one embodiment of the present invention. In pack mode, the memory block 101 is divided into two single port memory blocks 101D and 101E. Each of the single port memory blocks 101D and 101E can have a size up to one-half the size of the total memory block 101. The first single port memory block 101D is serviced by the Port A side, and the second single port memory block 101E is serviced by the Port B side. Each of memory blocks 101D and 101E is configured in SP mode and is operated in single clock mode. Thus, each of memory blocks 101D and 101E supports non-simultaneous read and write operations in accordance with a common clock signal.

Data to be written to the memory block 101D arrives at the data input connection (data_A) after being registered through the flip-flop 103, in accordance with the clock signal (A_inclk_data). The address to which the data is to be written arrives at the address input connection (addr_A) after being registered through the flip-flop 105, in accordance with the clock signal (A_inclk_addr). In SP mode, the read/write enable input connection (wren_A) is connected to receive a write enable signal. Thus, the read/write enable input connection (wren_A) is actually a write enable input connection (wren_A). The write enable signal arrives at the write enable input connection (wren_A) after being registered through the flip-flop 107, in accordance with the clock signal (A_inclk_wren). In one embodiment, a high signal is used to indicate the enabling of a write operation.

In SP mode, the address from which data is to be read arrives at the address input connection (addr_A) after being registered through the flip-flop 105, in accordance with the clock signal (A_inclk_addr). The data read from the memory block 101D is transmitted from the data output connection (q_A) through the flip-flop 109, in accordance with the clock signal (A_outclk). It should be appreciated that the clock signal (A_inclk_core) is used to synchronize operations within the core of the memory block 101D.

Data to be written to the memory block 101E arrives at the data input connection (data_B) after being registered through the flip-flop 111, in accordance with the clock signal (B_inclk_data). The address to which the data is to be written arrives at the address input connection (addr_B) after being registered through the flip-flop 113, in accordance with the clock signal (B_inclk_addr). In SP mode, the read/write enable input connection (wren_B) is connected to receive a write enable signal. Thus, the read/write enable input connection (wren_B) is actually a write enable input connection (wren_B). The write enable signal arrives at the write enable input connection (wren_B) after being registered through the flip-flop 115, in accordance with the clock signal (B_inclk_wren). In one embodiment, a high signal is used to indicate the enabling of a write operation.

In SP mode, the address from which data is to be read arrives at the address input connection (addr_B) after being registered through the flip-flop 113, in accordance with the clock signal (B_inclk_addr). The data read from the memory block 101E is transmitted from the data output connection (q_B) through the flip-flop 117, in accordance with the clock signal (B_outclk). It should be appreciated that the clock signal (B_inclk_core) is used to synchronize operations within the core of the memory block 101E.

In view of the foregoing, it should be appreciated that the FPGA architecture is defined to support the various clocking configurations through selection of appropriate configuration bit settings. FIG. 6A is an illustration showing configuration logic for configuring the clocking of the Port A input and output registers, in accordance with one embodiment of the present invention. Selection of the clock signal to be used by the input registers of Port A is provided by a two-to-one configuration multiplexer (CMUX) 601. The CMUX 601 receives a first input (clk0/vcc) and a second input (clk0/ce0). The first input (clk0/vcc) represents the first clock signal as discussed above with respect to FIGS. 1-5, without connection to a clock enable signal. The second input (clk0/ce0) represents the first clock signal as discussed above with respect to FIGS. 1-5, having been tied to the clock enable signal (ce0). Thus, the first input to CMUX 601 represents the first clock signal (clk0) without clock enable, and the second input to CMUX 601 represents the first clock signal (clk0) with clock enable.

The CMUX 601 is defined to pass through either the first or second input depending on the setting of a configuration bit used to control the configuration select signal (sel_601). The output of the CMUX 601 is referred as clock signal (A_inclk). The clock signal (A_inclk) is routed to be used as the previously described clock signals A_inclk_data, A_inclk_addr, A_inclk_wren, and A_inclk_core. Thus, the output of CMUX 601 represents the clock signal used to control each of flip-flops 103, 105, 107, as described with respect to FIG. 1.

Selection of the clock signal to be used by the output register of Port A (flip-flop 109 of FIG. 1) is provided by a series of two, two-to-one CMUXs 603 and 605. The CMUX 603 receives the first clock signal (clk0/vcc) and the second clock signal (clk0/ce0) as a first input and a second input, respectively. The CMUX 603 is defined to pass through either the first or second input depending on the setting of a configuration bit used to control the configuration select signal (sel_603). The output of CMUX 603 is provided as a second input to the CMUX 605. A first input to the CMUX 605 is the clock signal (B_tmp_outclk) generated by the clocking logic for Port B. The CMUX 605 is defined to pass through either the first or second input depending on the setting of a configuration select signal (sel_605). The output of the CMUX 605 is referred as clock signal (A_outclk). As described with respect to FIGS. 1-5, the clock signal (A_outclk) is used to control flip-flop 109.

Figure 6B:
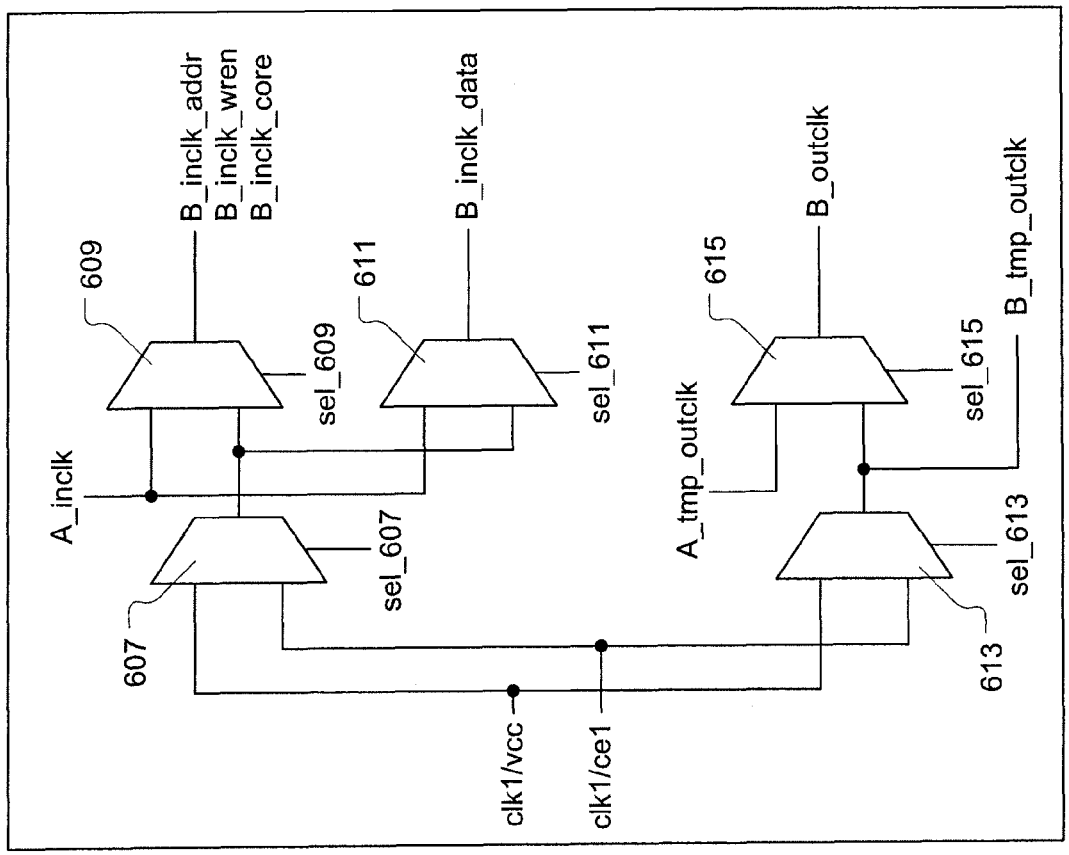
FIG. 6B is an illustration showing configuration logic for configuring the clocking of the Port B input and output registers, in accordance with one embodiment of the present invention.
Figure 6A:
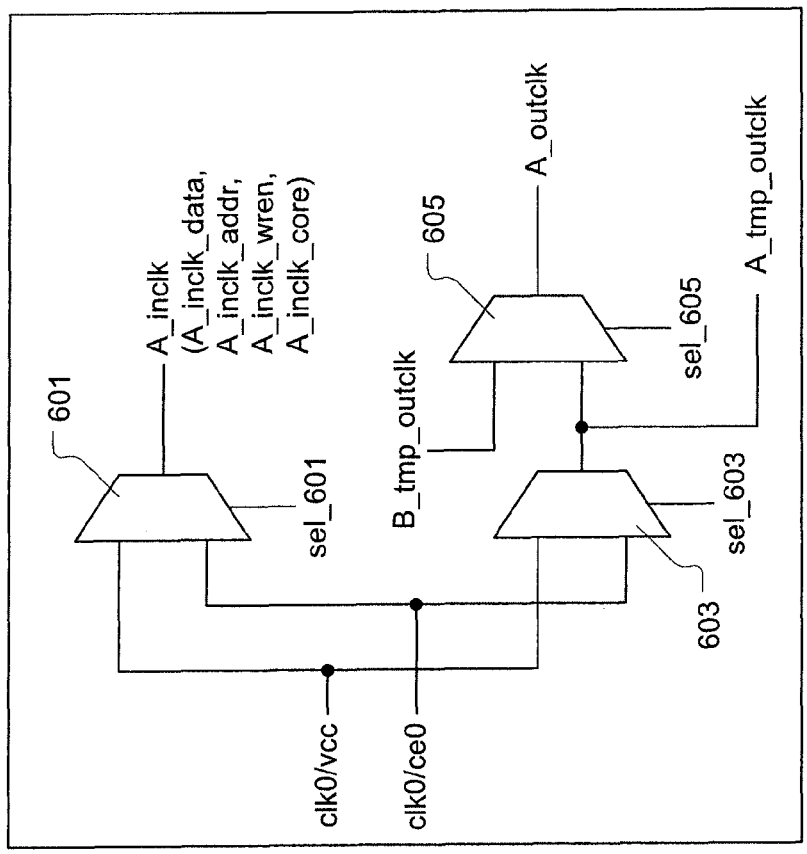
FIG. 6A is an illustration showing configuration logic for configuring the clocking of the Port A input and output registers, in accordance with one embodiment of the present invention.

FIG. 6B is an illustration showing configuration logic for configuring the clocking of the Port B input and output registers, in accordance with one embodiment of the present invention. Selection of the clock signal to be used by the input registers of Port B is provided by a series of two-to-one CMUXs 607/609 and 607/611. The CMUX 607 receives a first input (clk1/vcc) and a second input (clk1/ce1). The first input (clk1/vcc) represents the second clock signal as discussed above with respect to FIGS. 1-5, without connection to a clock enable signal. The second input (clk1/ce1) represents the second clock signal as discussed above with respect to FIGS. 1-5, having been tied to the clock enable signal (ce1). Thus, the first input to CMUX 607 represents the second clock signal (clk1) without clock enable, and the second input to CMUX 601 represents the second clock signal (clk1) with clock enable.

The CMUX 607 is defined to pass through either the first or second input depending on the setting of a configuration bit used to control the configuration select signal (sel_607). The output of CMUX 607 is provided as a second input to the CMUX 609. A first input to the CMUX 609 is the input clock signal (A_inclk) generated for Port A. The CMUX 609 is defined to pass through either the first or second input depending on the setting of a configuration bit used to control the configuration select signal (sel_609). The output of the CMUX 609 is routed to be used as the previously described clock signals B_inclk_addr, B_inclk_wren, and B_inclk_core. Another CMUX 611 is provided to receive the same two inputs as the CMUX 609, and provide the clock signal B_inclk_data in accordance with a select signal (sel_611). Thus, the clock signal used to control each of flip-flops 111, 113, and 115, as described with respect to FIG. 1, can be either (clk1/vcc), (clk1/ce1), or A_inclk.

Selection of the clock signal to be used by the output register of Port B (flip-flop 117 of FIG. 1) is provided by a series of two-to-one CMUXs 613 and 615. The CMUX 613 receives the first clock signal (clk1/vcc) and the second clock signal (clk1/ce1) as a first input and a second input, respectively. The CMUX 613 is defined to pass through either the first or second input depending on the setting of a configuration bit used to control the configuration select signal (sel_613). The output of CMUX 613 is provided as a second input to the CMUX 615. A first input to the CMUX 615 is the clock signal (A_tmp_outclk) generated by the clocking logic for Port A. The CMUX 615 is defined to pass through either the first or second input depending on the setting of a configuration bit used to control the configuration select signal (sel_615). The output of the CMUX 615 is referred as clock signal (B_outclk). As described with respect to FIGS. 1-5, the clock signal (B_outclk) is used to control flip-flop 117.

Figure 7B:
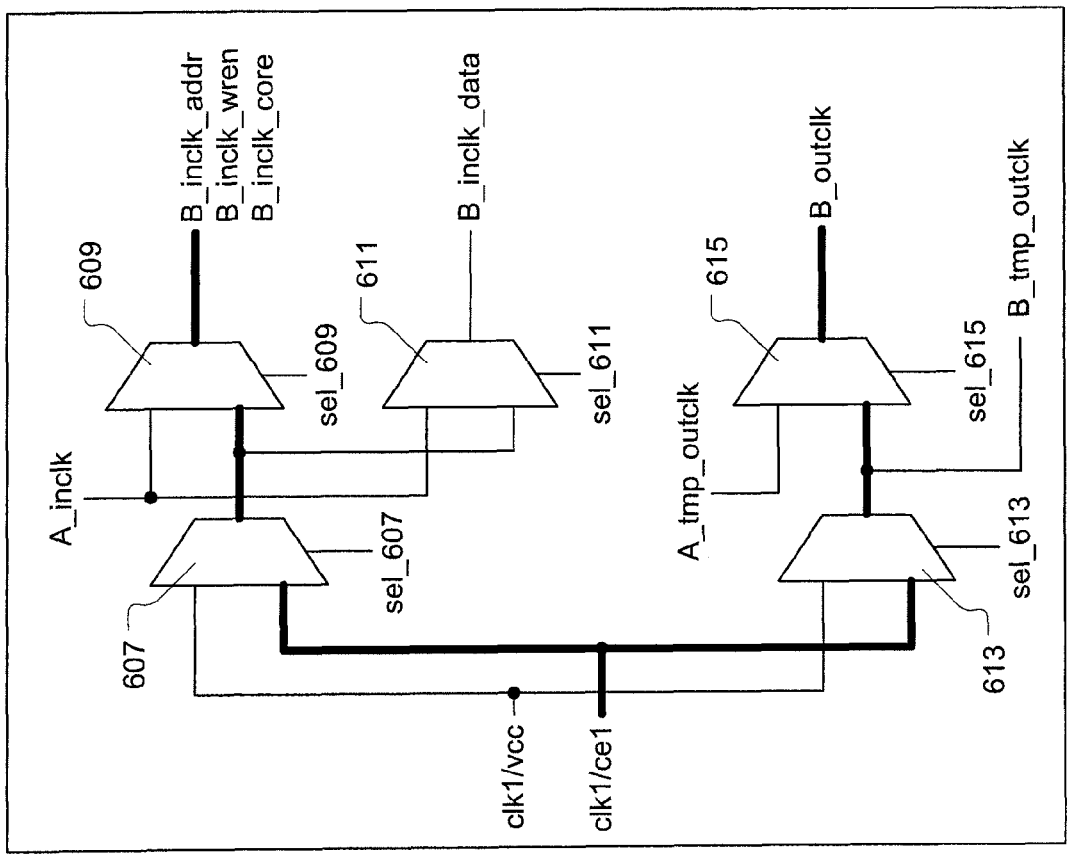
FIGS. 7A-7B are illustrations showing the configuration logic connectivity for configuring the clocking of Ports A and B when the memory block is configured to operate in SDP mode and read write clock mode, in accordance with one embodiment of the present invention.
Figure 7A:
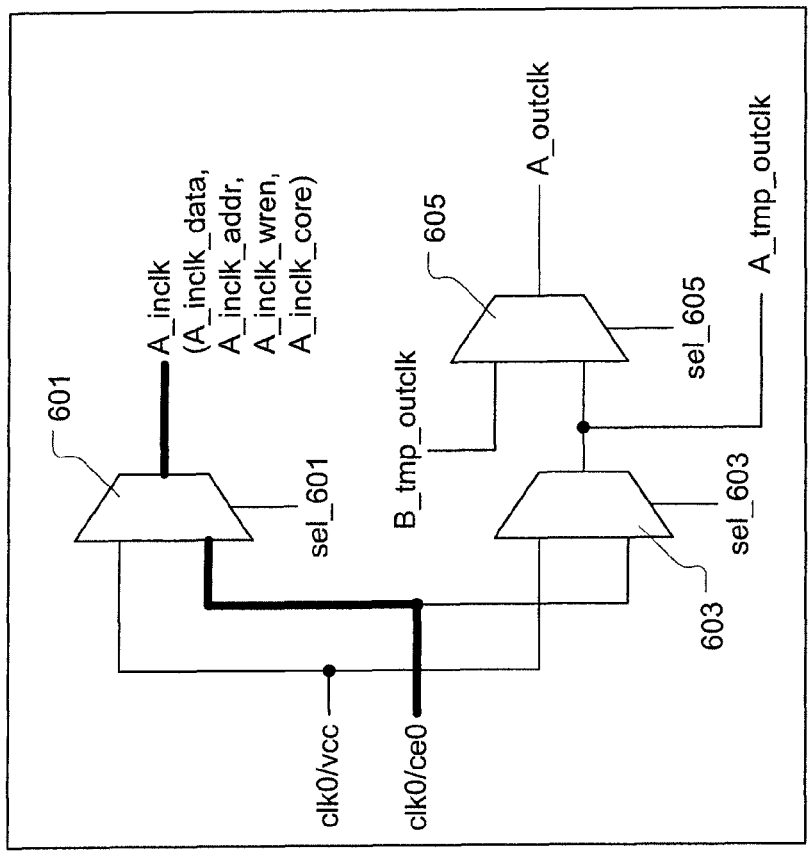

FIGS. 7A-7B are illustrations showing the configuration logic connectivity for configuring the clocking of Ports A and B when the memory block is configured to operate in SDP mode and read write clock mode, in accordance with one embodiment of the present invention. The bold lines in FIGS. 7A-7B represent the clock signal transmission paths through the configuration logic.

Figure 8B:
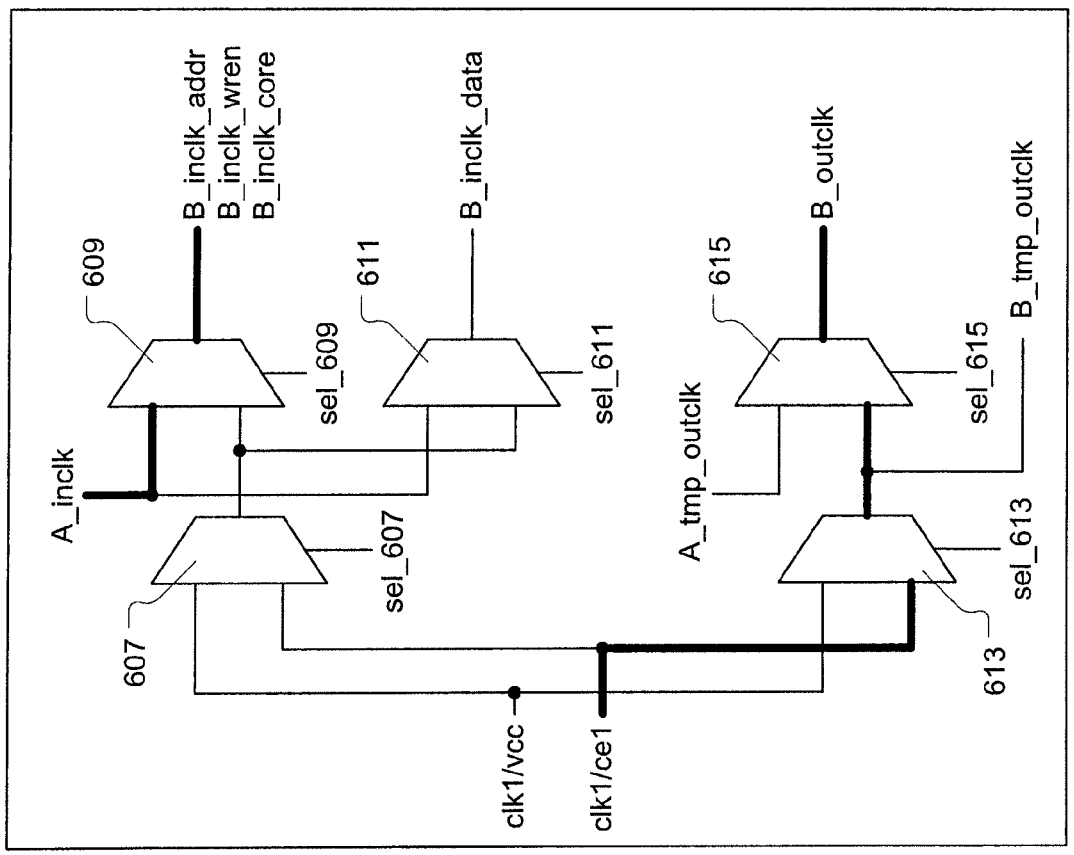
FIGS. 8A-8B are illustrations showing the configuration logic connectivity for configuring the clocking of Ports A and B when the memory block is configured to operate in SDP mode and input/output clock mode, in accordance with one embodiment of the present invention.
Figure 8A:
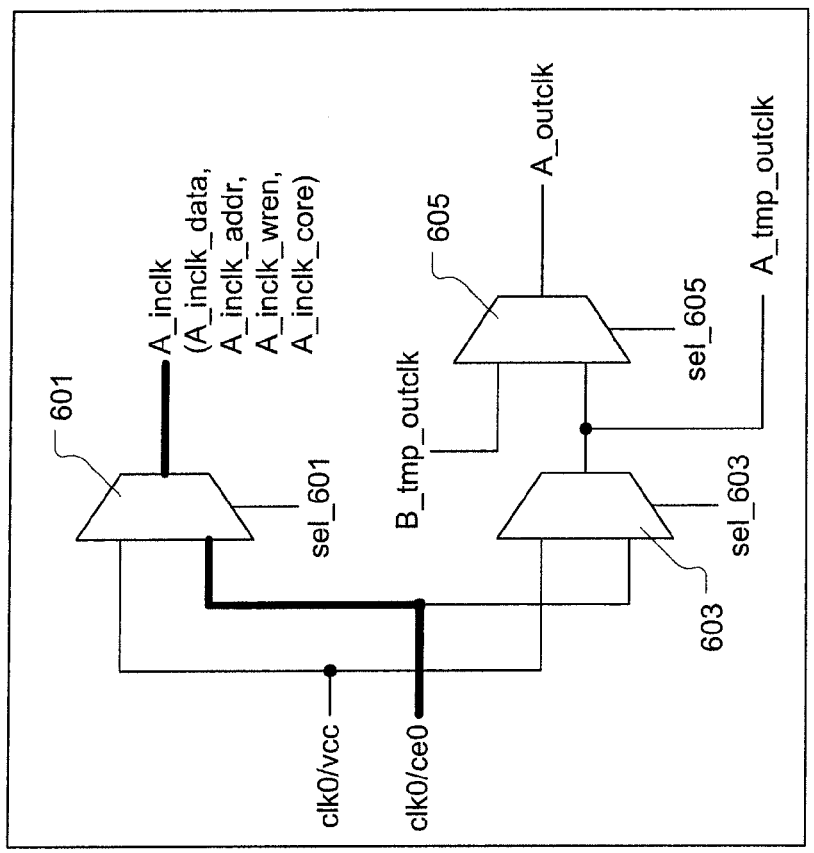

FIGS. 8A-8B are illustrations showing the configuration logic connectivity for configuring the clocking of Ports A and B when the memory block is configured to operate in SDP mode and input/output clock mode, in accordance with one embodiment of the present invention. The bold lines in FIGS. 8A-8B represent the clock signal transmission paths through the configuration logic.

FIGS. 9A-9B are illustrations showing the configuration logic connectivity for configuring the clocking of Ports A and B when the memory block is configured to operate in SDP mode and single clock mode, in accordance with one embodiment of the present invention. The bold lines in FIGS. 9A-9B represent the clock signal transmission paths through the configuration logic.

With reference to the memory block 101B configured to operate in SDP mode as shown in FIG. 3, it should be appreciated that the memory core logic is serviced by the clock signal A_inclk_core for write operation and by the clock signal B_inclk_core for read operations. Therefore, the clock signal B_inclk_core is not required when read operations are disabled, i.e., when the read enable signal (wren_B) is low. Thus, in the interest of conserving power, it desirable to turn off the clock signal B_inclk_core to the memory block 101B configured to operate in SDP mode, when read operations are disabled. However, as shown by the configuration logic connectivity illustrated in FIGS. 7A-9B, the clock signal B_inclk_core is supplied by the CMUX 609, which also supplies the clock signals B_inclk_addr, B_inclk_wren, and B_inclk_core. Hence, based on the Port A and Port B clocking configuration logic as shown in FIGS. 6A-6B it is not possible to independently turn off the clock signal B_inclk_core.

Figure 10:
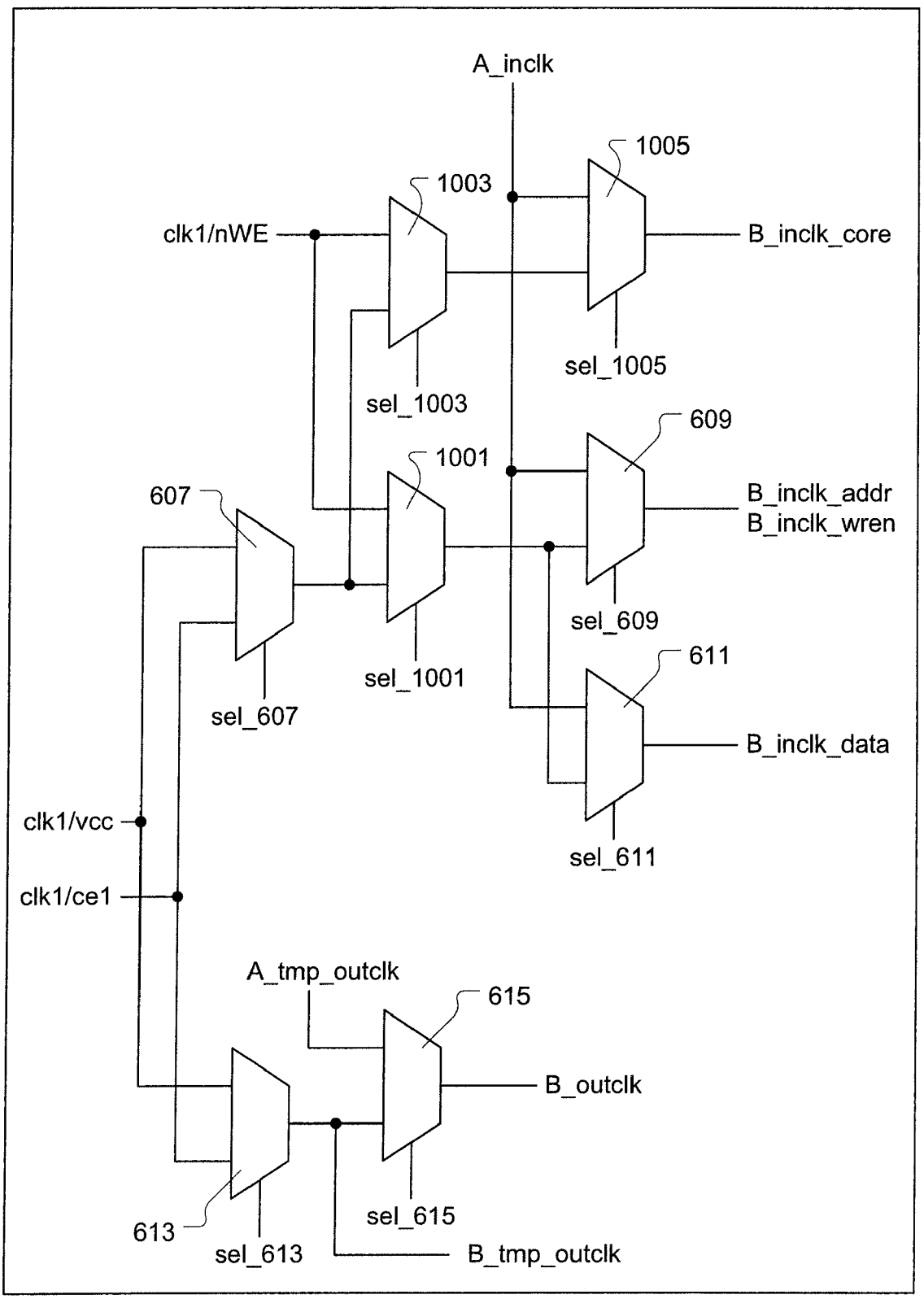
FIG. 10 is an illustration showing clocking configuration logic for Port B that supports independent control of the clock signal B_inclk_core, in accordance with one embodiment of the present invention.

FIG. 10 is an illustration showing clocking configuration logic for Port B that supports independent control of the clock signal B_inclk_core, in accordance with one embodiment of the present invention. It should be appreciated that the clocking configuration logic of FIG. 10 includes the same clocking configuration capability as provided by the logic of FIG. 6B. Therefore, the clocking configuration logic of FIG. 10 provides backward compatibility with respect to the logic of FIG. 6B. However, the logic of FIG. 10 provides the additional capability of independently controlling the clock signal B_inclk_core that services the core of the memory block from the Port B side.

Selection of the clock signal to be used by the address signal and read/write signal input registers of Port B is provided by a series of two-to-one CMUXs 607, 1001, and 609. The CMUX 607 receives a first input (clk1/vcc) and a second input (clk1/ce1). The first input (clk1/vcc) represents the second clock signal as discussed above with respect to FIGS. 1-5, without connection to a clock enable signal. The second input (clk1/ce1) represents the second clock signal as discussed above with respect to FIGS. 1-5, having been tied to the clock enable signal (ce1). The CMUX 607 is defined to pass through either the first or second input depending on the setting of a configuration bit used to control the configuration select signal (sel_607).

The output of CMUX 607 is provided as a second input to the CMUX 1001. A first input to the CMUX 1001 is the second clock signal as discussed above with respect to FIGS. 1-5, having been tied to a clock enable signal (nWE). The CMUX 1001 is defined to pass through either the first or second input depending on the setting of a configuration bit used to control the configuration select signal (sel_1001).

The output of the CMUX 1001 is provided as a second input to the CMUX 609. A first input to the CMUX 609 is the input clock signal (A_inclk) generated for Port A. The CMUX 609 is defined to pass through either the first or second input depending on the setting of a configuration bit used to control the configuration select signal (sel_609). The output of the CMUX 609 is routed to be used as the previously described clock signals B_inclk_addr and B_inclk_wren. Another CMUX 611 is provided to receive the same two inputs as the CMUX 609, and provide the clock signal B_inclk_data in accordance with a select signal (sel_611). Thus, the clock signal used to control each of flip-flops 111, 113, and 115, as described with respect to FIG. 1, can be either (clk1/vcc), (clk1/ce1), (clk1/nWE), or A_inclk.

Another CMUX 1003 is provided to receive the same two inputs as the CMUX 1001. The CMUX 1003 is defined to pass through either the first or second input depending on the setting of a configuration bit used to control the configuration select signal (sel_1003). The output of the CMUX 1003 is provided as a second input to the CMUX 1005. A first input to the CMUX 1005 is the input clock signal (A_inclk) generated for Port A. The CMUX 1005 is defined to pass through either the first or second input depending on the setting of a configuration bit used to control the configuration select signal (sel_1005). The output of the CMUX 1005 is routed to be used as the previously described clock signal B_inclk_core. Thus, the clock signal used to control the core of the memory block from the Port B side can be either (clk1/vcc), (clk1/ce1), (clk1/nWE), or A_inclk.

Furthermore, by setting the clock enable signal (nWE) low, the B_inclk_core clock signal can be effectively turned off. Thus, when the memory block is configured in SDP mode and the core clock signal from the Port B side is not required due to the disabling of read operations, the core clock signal from the Port B side can be turned off without affecting the B_inclk_addr and B_inclk_wren clock signal. It should be appreciated that turning off the core clock signal from the Port B side (B_inclk_core) when read operations are disabled, i.e., when the read enable signal (wren_B) is low, results in an overall power savings.

In one embodiment, the clock enable signal (nWE) is provided through the read/write enable input connection (wren_B) of the Port B side. This embodiment enables the Port B clocking configuration logic to be realized without having to add an input connection to the memory block 101. It should be appreciated that assignment of the read/write enable input connection (wren_B) for combined use as the clock enable signal (nWE) is appropriate because a low read enable signal (wren_B) will serve to both disable read operations and effectively turn off the core clock signal from the Port B side (B_inclk_core), when the memory block is configured in SDP mode and input/output clock mode.

Figure 11:
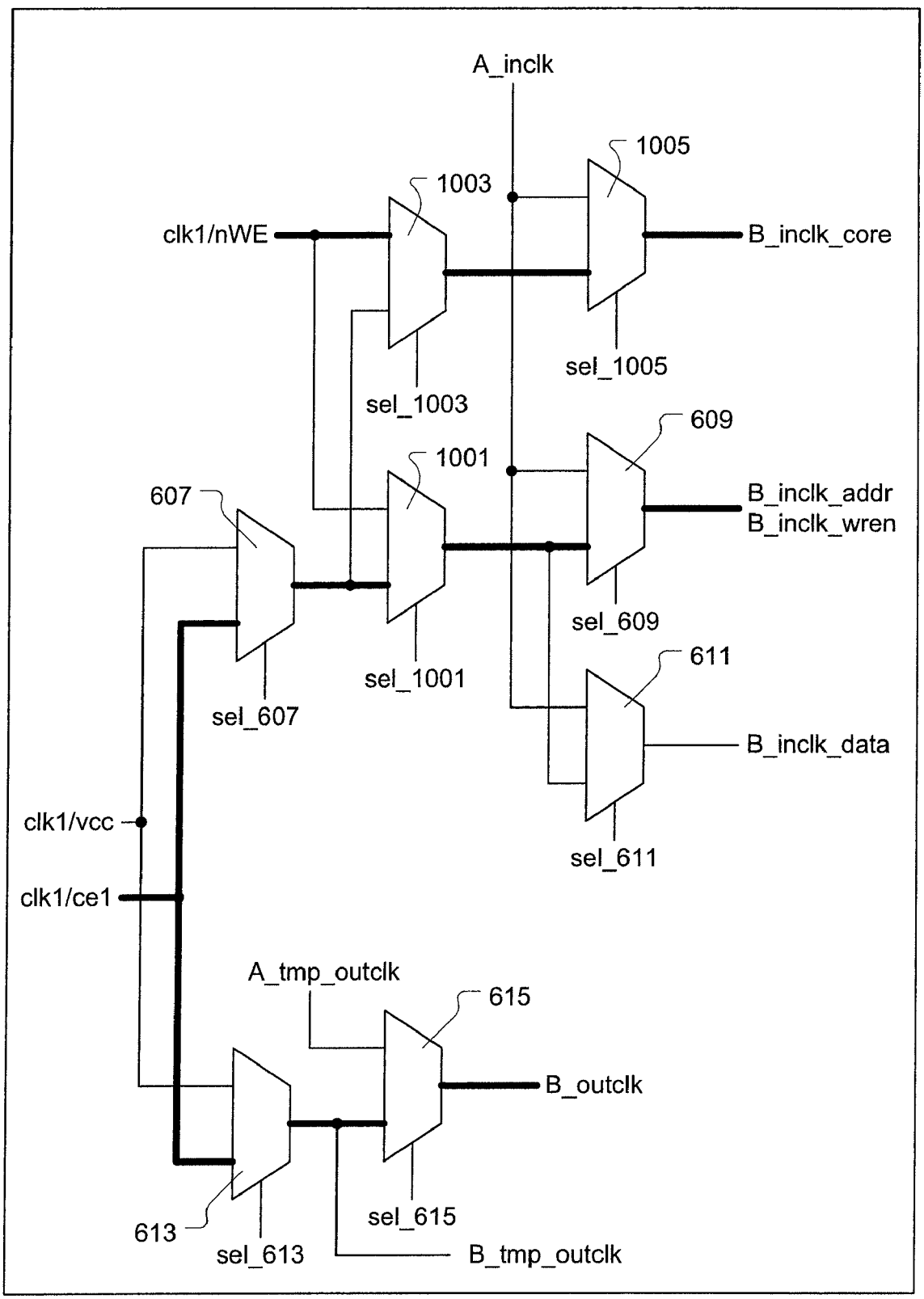
FIG. 11 is an illustration showing the clocking configuration logic connectivity for Port B of the memory block configured to operate in SDP mode and read/write clock mode with power savings capability, in accordance with one embodiment of the present invention.

FIG. 11 is an illustration showing the clocking configuration logic connectivity for Port B of the memory block 101B configured to operate in SDP mode and read/write clock mode with power savings capability, in accordance with one embodiment of the present invention. The bold lines in FIG. 11 represent the clock signal transmission paths through the configuration logic. When the memory block 101 is configured to operate in power savings mode, the CMUXs 1003 and 1005 are configured to transmit the clock signal (clk1/nWE) for use as the clock signal B_inclk_core. Thus, in power savings mode, the clock signal B_inclk_core can be effectively turned off by controlling the clock enable signal (nWE).

Figure 12A:
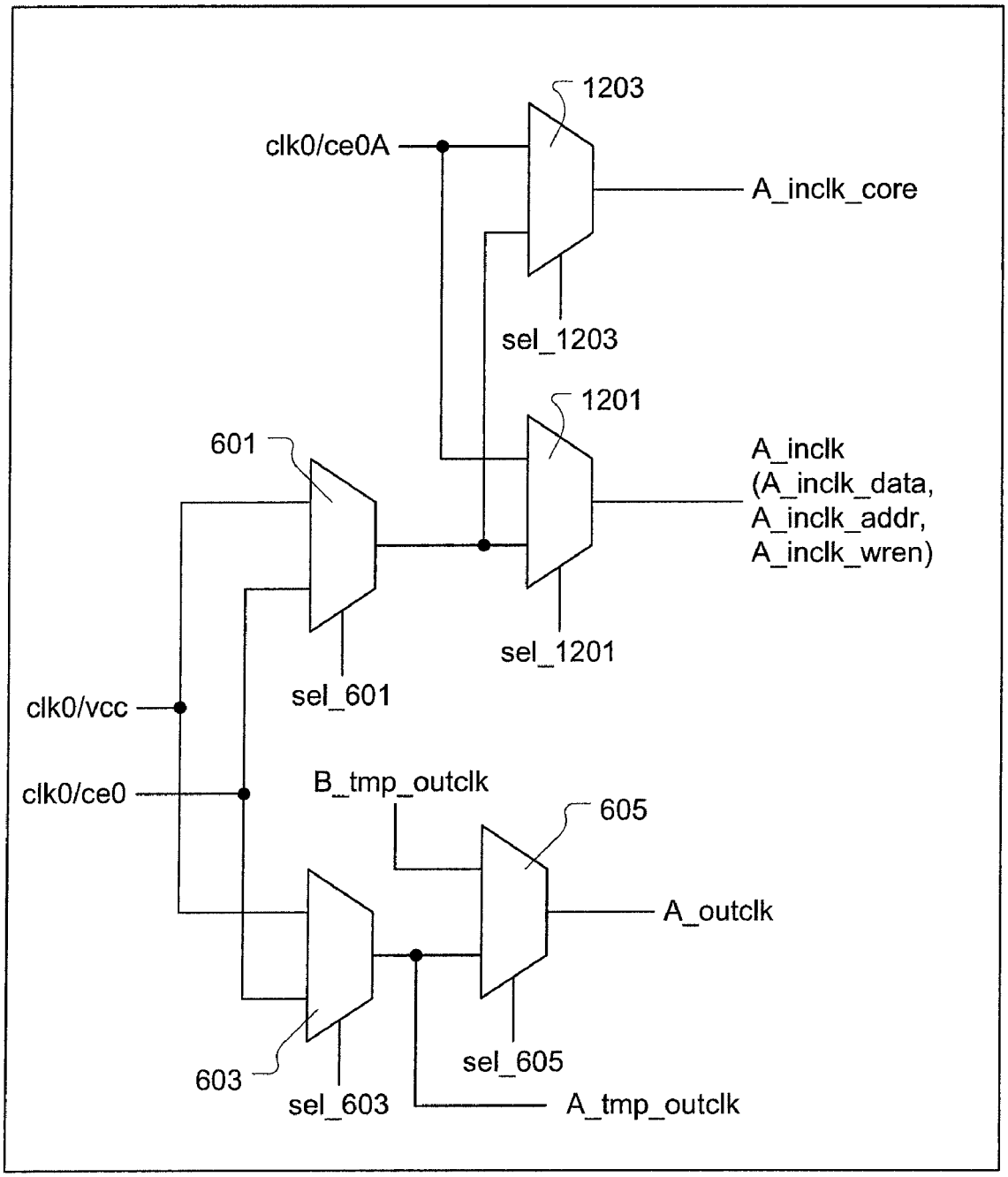
FIG. 12A is an illustration showing clocking configuration logic for Port A that supports independent control of the clock signal A_inclk_core, in accordance with one embodiment of the present invention.

FIG. 12A is an illustration showing clocking configuration logic for Port A that supports independent control of the clock signal A_inclk_core, in accordance with one embodiment of the present invention. It should be appreciated that the clocking configuration logic of FIG. 12A includes the same clocking configuration capability as provided by the logic of FIG. 6A. Therefore, the clocking configuration logic of FIG. 12A provides backward compatibility with respect to the logic of FIG. 6A. However, the logic of FIG. 12A provides the additional capability of independently controlling the clock signal A_inclk_core that services the core of the memory block from the Port A side.

Selection of the clock signal to be used by the data input signal, address signal and read/write enable signal input registers of Port A is provided by a series of two-to-one CMUXs 601 and 1201. The CMUX 601 receives a first input (clk0/vcc) and a second input (clk0/ce0). The first input (clk0/vcc) represents the first clock signal as discussed above with respect to FIGS. 1-5, without connection to a clock enable signal. The second input (clk0/ce0) represents the first clock signal as discussed above with respect to FIGS. 1-5, having been tied to the clock enable signal (ce0). The CMUX 601 is defined to pass through either the first or second input depending on the setting of a configuration bit used to control the configuration select signal (sel_601).

The output of CMUX 601 is provided as a second input to the CMUX 1201. A first input to the CMUX 1201 is the first clock signal as discussed above with respect to FIGS. 1-5, having been tied to a clock enable signal (ce0A). The CMUX 1201 is defined to pass through either the first or second input depending on the setting of a configuration bit used to control the configuration select signal (sel_1201). The output of the CMUX 1201 is provided as clock signal (A_inclk). The clock signal (A_inclk) is routed to be used as the previously described clock signals A_inclk_data, A_inclk_addr, and A_inclk_wren.

Another CMUX 1203 is provided to receive the same two inputs as the CMUX 1201. The CMUX 1203 is defined to pass through either the first or second input depending on the setting of a configuration bit used to control the configuration select signal (sel_1203). The output of the CMUX 1203 is routed to be used as the previously described clock signal A_inclk_core. Thus, the clock signal used to control the core of the memory block from the Port A side can be either (clk0/vcc), (clk0/ce0), or (clk0/ce0A). Furthermore, by setting the clock enable signal (ce0A) low, the A_inclk_core clock signal can be effectively turned off. In the embodiment of FIG. 12A, each of the clock enable signals (ce0) and (ce0A) is provided through a respective dedicated input connection to the memory block 101.

Figure 12B:
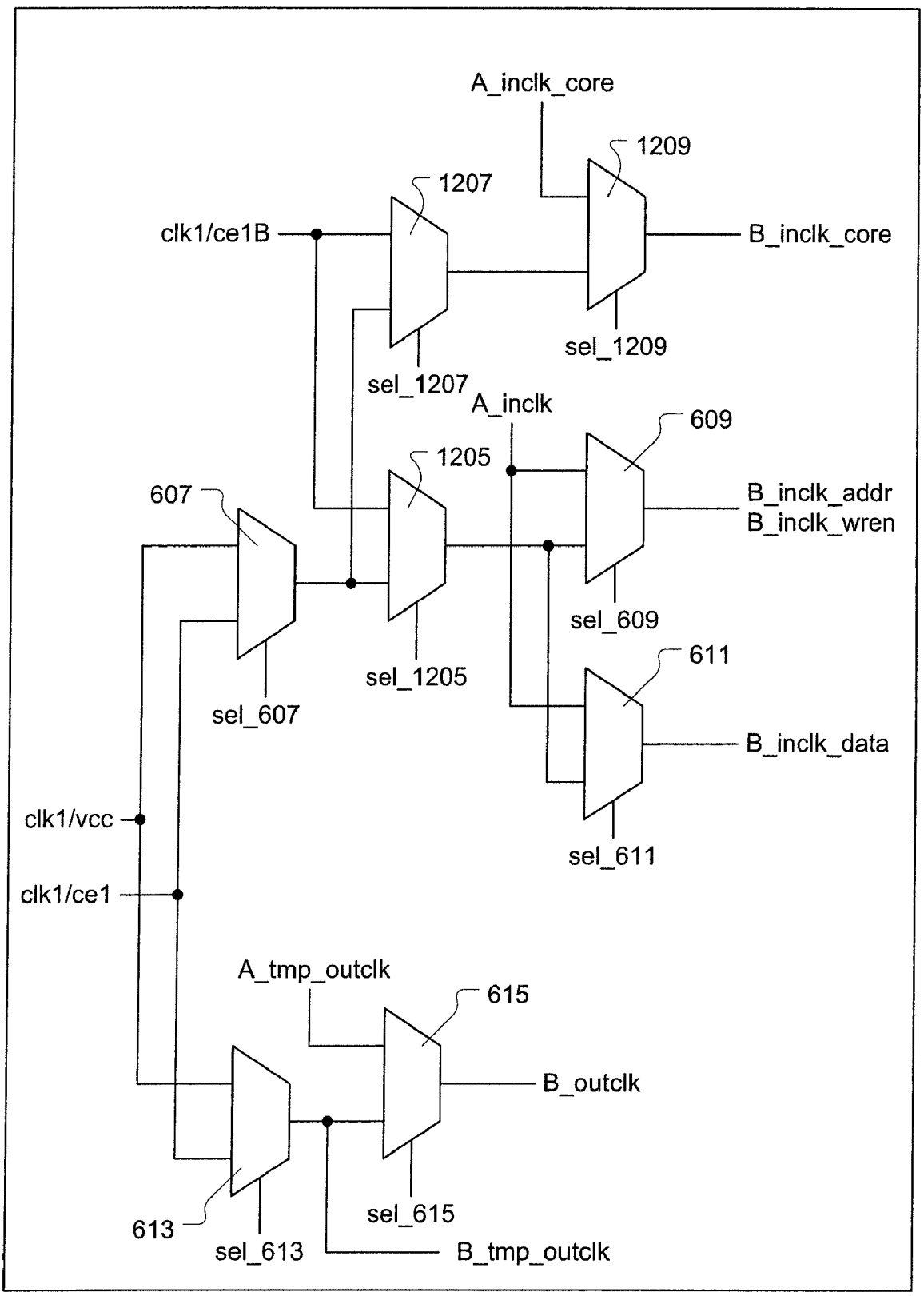
FIG. 12B is an illustration showing the clocking configuration logic for Port B that is implemented in conjunction with the Port A clocking configuration logic of FIG. 12A, in accordance with one embodiment of the present invention.

FIG. 12B is an illustration showing the clocking configuration logic for Port B that is implemented in conjunction with the Port A clocking configuration logic of FIG. 12A, in accordance with one embodiment of the present invention. It should be appreciated that the clocking configuration logic of FIG. 12B includes the same clocking configuration capability as provided by the logic of FIG. 6B. Therefore, the clocking configuration logic of FIG. 12B provides backward compatibility with respect to the logic of FIG. 6B. However, the logic of FIG. 12B provides the additional capability of independently controlling the clock signal B_inclk_core that services the core of the memory block from the Port B side.

Selection of the clock signal to be used by the address signal and read/write signal input registers of Port B is provided by a series of two-to-one CMUXs 607, 1205, and 609. The CMUX 607 receives a first input (clk1/vcc) and a second input (clk1/ce1). The first input (clk1/vcc) represents the second clock signal as discussed above with respect to FIGS. 1-5, without connection to a clock enable signal. The second input (clk1/ce1) represents the second clock signal as discussed above with respect to FIGS. 1-5, having been tied to the clock enable signal (ce1). The CMUX 607 is defined to pass through either the first or second input depending on the setting of a configuration bit used to control the configuration select signal (sel_607).

The output of CMUX 607 is provided as a second input to the CMUX 1205. A first input to the CMUX 1205 is the second clock signal as discussed above with respect to FIGS. 1-5, having been tied to a clock enable signal (ce1B). The CMUX 1205 is defined to pass through either the first or second input depending on the setting of a configuration bit used to control the configuration select signal (sel_1205).

The output of the CMUX 1205 is provided as a second input to the CMUX 609. A first input to the CMUX 609 is the input clock signal (A_inclk) generated for Port A. The CMUX 609 is defined to pass through either the first or second input depending on the setting of a configuration bit used to control the configuration select signal (sel_609). The output of the CMUX 609 is routed to be used as the previously described clock signals B_inclk_addr and B_inclk_wren. Another CMUX 611 is provided to receive the same two inputs as the CMUX 609, and provide the clock signal B_inclk_data in accordance with a select signal (sel_611). Thus, the clock signal used to control each of flip-flops 111, 113, and 115, as described with respect to FIG. 1, can be either (clk1/vcc), (clk1/ce1), (clk1/ce1B), or A_inclk.

Another CMUX 1207 is provided to receive the same two inputs as the CMUX 1205. The CMUX 1207 is defined to pass through either the first or second input depending on the setting of a configuration bit used to control the configuration select signal (sel_1207). The output of the CMUX 1207 is provided as a second input to the CMUX 1209. A first input to the CMUX 1209 is the memory core clock signal (A_inclk_core) generated for Port A. The CMUX 1209 is defined to pass through either the first or second input depending on the setting of a configuration bit used to control the configuration select signal (sel_209). The output of the CMUX 1209 is routed to be used as the previously described clock signal B_inclk_core. Thus, the clock signal used to control the core of the memory block from the Port B side can be either (clk1/vcc), (clk1/ce1), (clk1/ce1B), or A_inclk_core. Furthermore, by setting the clock enable signal (ce1B) low, the B_inclk_core clock signal can be effectively turned off. In the embodiment of FIG. 12B, each of the clock enable signals (ce0) and (ce1B) is provided through a respective dedicated input connection to the memory block 101.

The clocking configuration logic for Ports A and B as described above with respect to FIGS. 12A and 12B, respectively, enables operation of the memory block in power savings mode, such that the memory core clock signal from either Port A or Port B can be effectively turned off when not needed. Additionally, the clocking configuration logic of FIGS. 12A and 12B enables each of Port A and Port B to be operated in more than just single clock mode when configured in pack mode.

For example, if the memory block is configured in pack mode (see FIG. 5) with the clocking capability afforded by the logic of FIGS. 12A and 12B, it should be appreciated that each of Ports A and B will have two separately controlled clock enable signals. Specifically, Port A will have clock enable signals (ce0) and (ce0A). Port B will have clock enable signals (ce1) and (ce1B). Considering Port A in pack mode, the two clock enable signals (ce0) and (ce0A) can be used for the input and output registers, respectively, although tied to the same clock signal (clk0). Thus, Port A in pack mode can be operated in input/output clock mode. Similarly, considering Port B in pack mode, the two clock enable signals (ce1) and (ce1A) can be used for the input and output registers, respectively, although tied to the same clock signal (clk1). Thus, Port B in pack mode can be operated in input/output clock mode. Thus, the clock enable input connections provided on each of Ports A and B enables configuration of the memory in pack mode, with operation of each of Ports A and B in either input/output clock mode, or single clock mode.

It should be appreciated that with two clock enable signals on each of Port A and Port B, the memory block can be configured in additional packed configurations. For example, if in TDP mode the input and output registers use separate respective clock enable signals that are tied to the same clock signal, the clocking configuration logic of FIGS. 12A-12B enables the memory block to be packed with two TDP mode memory configurations. Similarly, for example, if in SDP mode the input and output registers use separate respective clock enable signals that are tied to the same clock signal, the clocking configuration logic of FIGS. 12A-12B enables the memory block to be packed with two SDP mode memory configurations. Without the clocking configuration logic of FIGS. 12A-12B, the output registers of Port A and Port B would have to be moved outside the memory block, i.e., be implemented in logic blocks of the FPGA, to realize a pseudo-packed configuration of TDP mode or SDP mode. It should be appreciated that the possible packed memory configurations enabled by the clocking configuration logic of FIGS. 12A-12B are not limited to TDP mode or SDP mode. In other embodiments, packed memory configurations beyond TDP mode or SDP mode may be realized.

Furthermore, even if the memory block is not configured in pack mode, the additional clock enable signals provided on Port A and Port B by the clocking configuration logic of FIGS. 12A-12B can be used to save power. For example, if the memory block is configured in SP mode and input/output clock mode, the clock signal (clk0/ce0) can be used to control the input registers on Port A, the clock signal (clk1/ce1) can be used to control the output register on Port A, and the clock signal (clk1/ce1B) can be used to shut down the Port B side by tying (ce1B) to 0, i.e., to a low state. It should be appreciated that without the clocking configuration logic of FIGS. 12A-12B, the clock signal (clk1) would have to be allowed to toggle on Port B, thus wasting power. Similarly, in SDP mode, the clock signal to the output register on Port A (which is not used in SDP mode) can be shut off by using the additional clock enable signal, thus saving power.

It should be appreciated that benefits beyond power savings may be realized by having independent core clock and input clock control on each port of the memory block. For example, some applications may desire to control the input registers and the core separately for functional reasons. Thus, the various exemplary embodiments for applying the clocking configuration logic of FIGS. 12A-12B, as described herein, are not intended to represent an inclusive set of possible embodiments.

With consideration of the foregoing discussion, clock configuration logic for a memory block of a programmable logic device is provided in accordance with one embodiment of the present invention. In this embodiment, the configuration logic of FIG. 6A represents a first set of clock configuration logic configurable to provide a first port input clock signal (A_inclk) for controlling input registers of a first port (Port A) of the memory block 101. The first set of clock configuration logic is also configurable to provide a first port core clock signal (A_inclk_core) for controlling a core of the memory block 101. The first port core clock signal (A_inclk_core) is the same as the first port input clock signal (A_inclk).

Also in the present embodiment, the configuration logic of FIG. 10 represents a second set of clock configuration logic configurable to provide a second port input clock signal (B_inclk_addr, B_inclk_wren, B_inclk_data) for controlling input registers of a second port (Port B) of the memory block 101. The second set of clock configuration logic is also configurable to provide a second port core clock signal (B_inclk_core) for controlling the core of the memory block 101. The second port core clock signal (B_inclk_core) can be controlled independently from the second port input clock signal (B_inclk_addr, B_inclk_wren, B_inclk_data).

The second set of clock configuration logic as shown in FIG. 10 includes a first configuration multiplexer (607), a second configuration multiplexer (1003), a third configuration multiplexer (1005), a fourth configuration multiplexer (1001), a fifth configuration multiplexer (609), and sixth configuration multiplexer (611). The first configuration multiplexer includes an input routed to receive a first clock signal (clk1/vcc) and an input routed to receive the first clock signal tied to a first clock enable signal (clk1/ce1). The second configuration multiplexer (1003) includes an input routed to receive an output of the first configuration multiplexer (607), and an input routed to receive the first clock signal tied to a second clock enable signal (clk/nWE). The third configuration multiplexer (1005) includes an input routed to receive an output of the second configuration multiplexer (1003), and an input routed to receive the first port input clock signal (A_inclk). An output of the third configuration multiplexer (1005) is routed to provide the second port core clock signal (B_inclk_core).

The fourth configuration multiplexer (1001) includes an input routed to receive the output of the first configuration multiplexer (607), and an input routed to receive the first clock signal tied to the second clock enable signal (clk1/nWE). The fifth configuration multiplexer (609) includes an input routed to receive an output of the fourth configuration multiplexer (1001), and an input routed to receive the first port input clock signal (A_inclk). An output of the fifth configuration multiplexer (609) is routed to provide the second port input clock signal for controlling an address input register of the second port (B_inclk_addr) and a write enable input register of the second port (B_inclk_wren).

The sixth configuration multiplexer (611) includes an input routed to receive the output of the fourth configuration multiplexer (1001), and an input routed to receive the first port input clock signal (A_inclk). An output of the sixth configuration multiplexer (611) is routed to provide the second port input clock signal for controlling a data input register of the second port (B_inclk_data).

With consideration of the foregoing discussion, clock configuration logic for a memory block of a programmable logic device is provided in accordance with another embodiment of the present invention. In this embodiment, the configuration logic of FIG. 12A represents a first set of clock configuration logic configurable to provide a first port input clock signal (A_inclk) for controlling input registers of a first port (Port A) of the memory block 101. The first set of clock configuration logic is also configurable to provide a first port core clock signal (A_inclk_core) for controlling a core of the memory block 101. The first port core clock signal (A_inclk_core) can be controlled independently from the first port input clock signal (A_inclk).

Also in the present embodiment, the configuration logic of FIG. 12B represents a second set of clock configuration logic configurable to provide a second port input clock signal (B_inclk_addr, B_inclk_wren, B_inclk_data) for controlling input registers of a second port (Port B) of the memory block 101. The second set of clock configuration logic is also configurable to provide a second port core clock signal (B_inclk_core) for controlling the core of the memory block 101. The second port core clock signal (B_inclk_core) can be controlled independently from the second port input clock signal (B_inclk_addr, B_inclk_wren, B_inclk_data).

With reference to FIG. 12A, the first set of clock configuration logic includes a first configuration multiplexer (601), a second configuration multiplexer (1203), and a third configuration multiplexer (1201). The first configuration multiplexer (601) includes an input routed to receive a first clock signal (clk0/vcc), and an input routed to receive the first clock signal tied to a first clock enable signal (clk0/ce0). The second configuration multiplexer (1203) includes an input routed to receive an output of the first configuration multiplexer (601), and an input routed to receive the first clock signal tied to a second clock enable signal (clk0/ce0A). An output of the second multiplexer (1203) is routed to provide the first port core clock signal (A_inclk_core). The third configuration multiplexer (1201) includes an input routed to receive the output of the first configuration multiplexer (601), and an input routed to receive the first clock signal tied to the second clock enable signal (clk0/ce0A). An output of the third configuration multiplexer (1201) is routed to provide the first port input clock signal (A_inclk) for controlling an address input register of the first port (A_inclk_addr), a write enable input register of the first port (A_inclk_wren), and a data input register of the first port (A_inclk_data).

With reference to FIG. 12B, the second set of clock configuration logic includes a first configuration multiplexer (607), a second configuration multiplexer (1207), a third configuration multiplexer (1209), a fourth configuration multiplexer (1205), a fifth configuration multiplexer (609), and a sixth configuration multiplexer (611). The first configuration multiplexer (607) includes an input routed to receive a first clock signal (clk1/vcc), and an input routed to receive the first clock signal tied to a first clock enable signal (clk1/ce1). The second configuration multiplexer (1207) includes an input routed to receive an output of the first configuration multiplexer (607), and an input routed to receive the first clock signal tied to a second clock enable signal (clk1/ce1B). The third configuration multiplexer (1209) includes an input routed to receive an output of the second configuration multiplexer (1207), and an input routed to receive the first port core clock signal (A_inclk_core). An output of the third configuration multiplexer (1209) is routed to provide the second port core clock signal (B_inclk_core).

The fourth configuration multiplexer (1205) includes an input routed to receive the output of the first configuration multiplexer (607), and an input routed to receive the first clock signal tied to the second clock enable signal (clk1/ce1B). The fifth configuration multiplexer (609) includes an input routed to receive the output of the fourth configuration multiplexer (1205), and an input routed to receive the first port input clock signal (A_inclk). An output of the fifth configuration multiplexer (609) is routed to provide the second port input clock signal for controlling an address input register of the second port (B_inclk_addr) and a write enable input register of the second port (B_inclk_wren).

The sixth configuration multiplexer (611) includes an input routed to receive the output of the fourth configuration multiplexer (1205), and an input routed to receive the first port input clock signal (A_inclk). An output of the sixth configuration multiplexer (611) is routed to provide the second port input clock signal for controlling a data input register of the second port (B_inclk_data).

Figure 13:
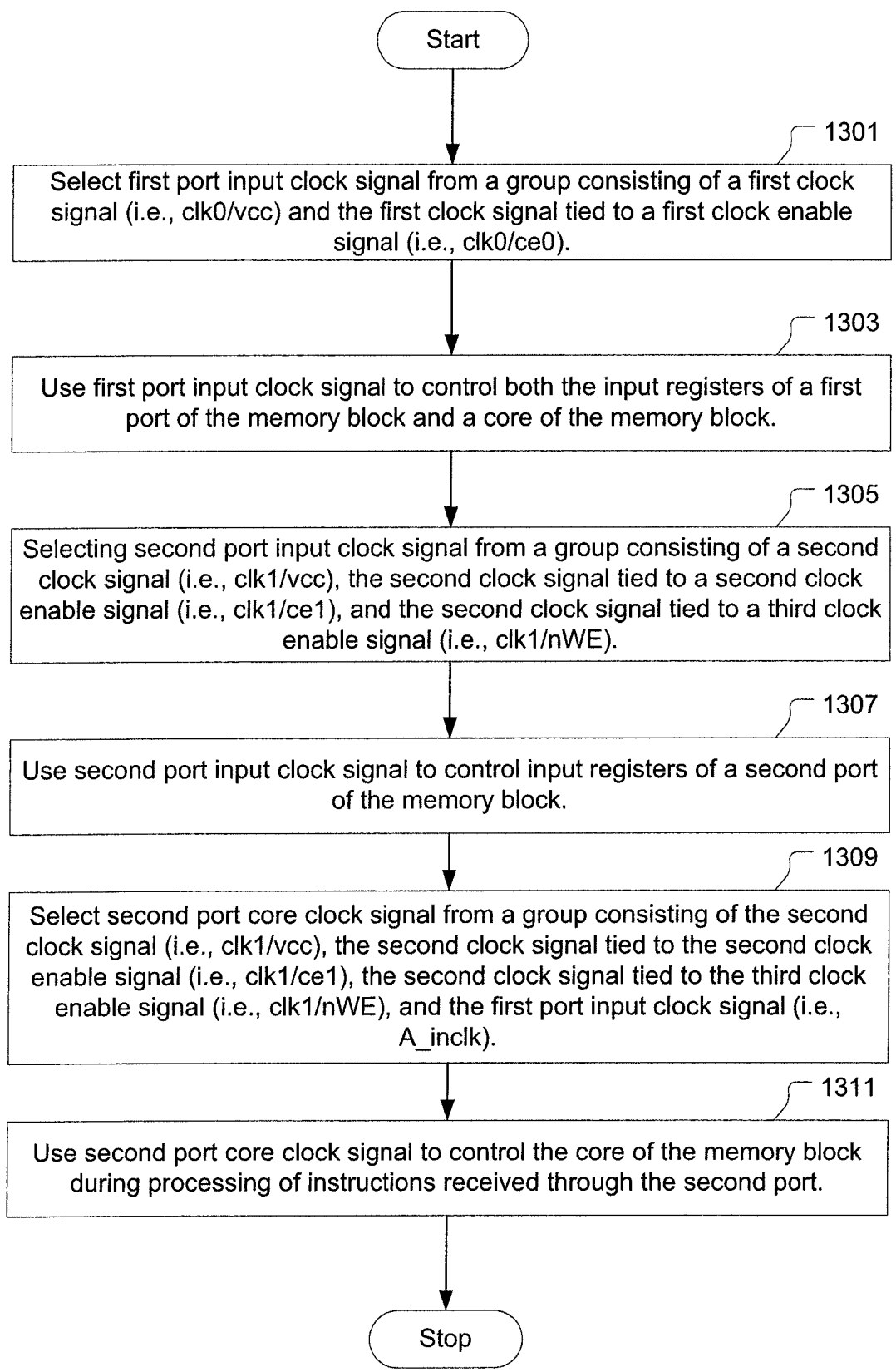
FIG. 13 is an illustration showing a flowchart of a method for configuring clock signals to control a memory block in a programmable logic device, in accordance with one embodiment of the present invention.

FIG. 13 is an illustration showing a flowchart of a method for configuring clock signals to control a memory block in a programmable logic device, in accordance with one embodiment of the present invention. The method includes an operation 1301 for selecting a first port input clock signal from a group consisting of a first clock signal (i.e., clk0/vcc) and the first clock signal tied to a first clock enable signal (i.e., clk0/ce0). An operation 1303 is provided for using the first port input clock signal to control both the input registers of a first port (Port A) of the memory block and a core of the memory block during processing of instructions received through the first port.

The method also includes an operation 1305 for selecting a second port input clock signal from a group consisting of a second clock signal (i.e., clk1/vcc), the second clock signal tied to a second clock enable signal (i.e., clk1/ce1), and the second clock signal tied to a third clock enable signal (i.e., clk1/nWE). An operation 1307 is provided for using the second port input clock signal to control input registers of a second port (Port B) of the memory block.

The method further includes an operation 1309 for selecting a second port core clock signal from a group consisting of the second clock signal (i.e., clk1/vcc), the second clock signal tied to the second clock enable signal (i.e., clk1/ce1), the second clock signal tied to the third clock enable signal (i.e., clk1/nWE), and the first port input clock signal (i.e., A_inclk). An operation 1311 is provided for using the second port core clock signal to control the core of the memory block during processing of instructions received through the second port. It should be appreciated that the first port input clock signal, the second port input clock signal, and the second port core clock signal are selected by setting configuration bits in a configuration memory of the programmable logic device.

Figure 14:
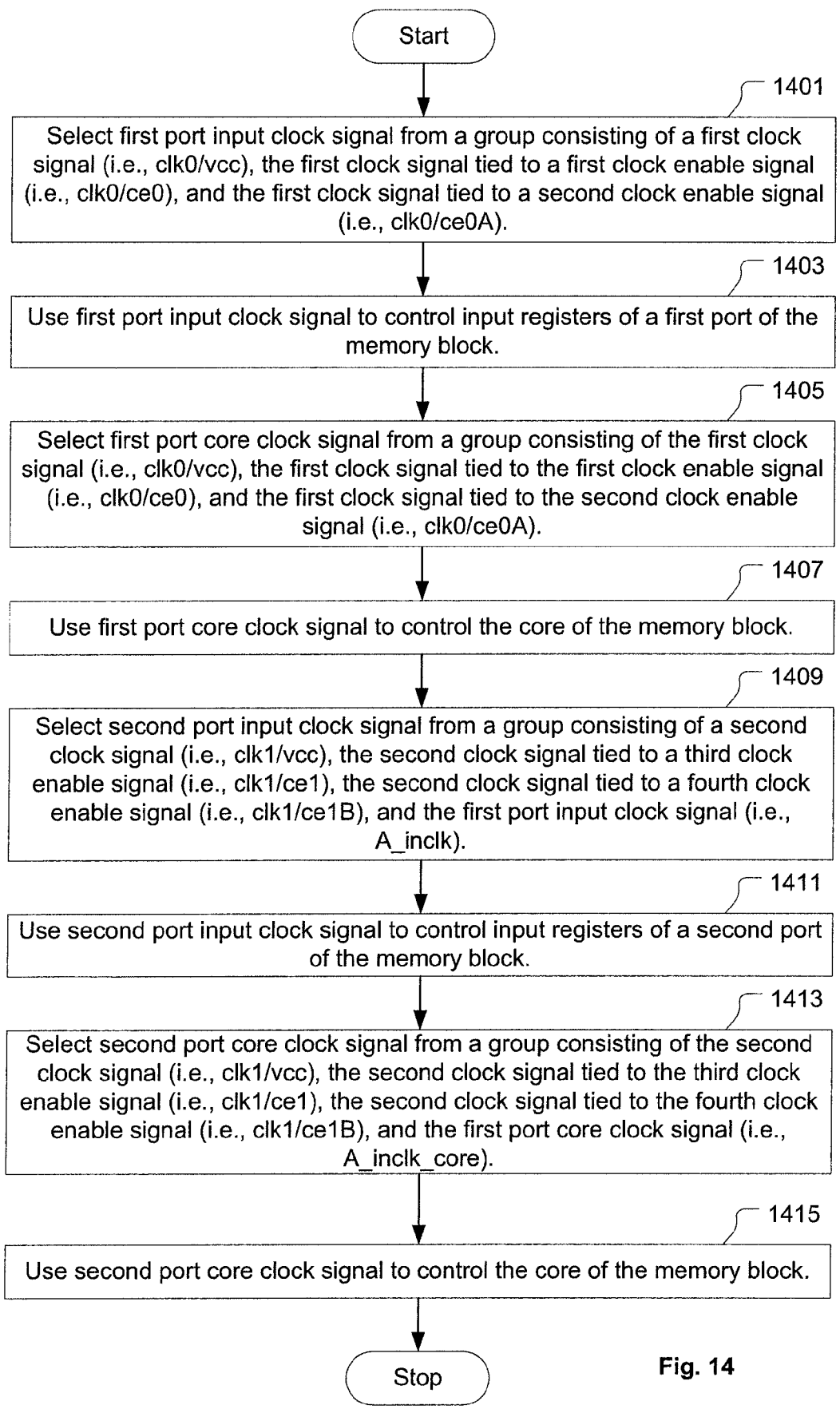
FIG. 14 is an illustration showing a flowchart of a method for configuring clock signals to control a memory block in a programmable logic device, in accordance with another embodiment of the present invention.

FIG. 14 is an illustration showing a flowchart of a method for configuring clock signals to control a memory block in a programmable logic device, in accordance with another embodiment of the present invention. The method includes an operation 1401 for selecting a first port input clock signal from a group consisting of a first clock signal (i.e., clk0/vcc), the first clock signal tied to a first clock enable signal (i.e., clk0/ce0), and the first clock signal tied to a second clock enable signal (i.e., clk0/ce0A). An operation 1403 is provided for using the first port input clock signal to control input registers of a first port (Port A) of the memory block.

The method also includes an operation 1405 for selecting a first port core clock signal from a group consisting of the first clock signal (i.e., clk0/vcc), the first clock signal tied to the first clock enable signal (i.e., clk0/ce0), and the first clock signal tied to the second clock enable signal (i.e., clk0/ce0A). An operation 1407 is provided for using the first port core clock signal to control the core of the memory block during processing of instructions received through the first port (Port A).

The method further includes an operation 1409 for selecting a second port input clock signal from a group consisting of a second clock signal (i.e., clk1/vcc), the second clock signal tied to a third clock enable signal (i.e., clk1/ce1), the second clock signal tied to a fourth clock enable signal (i.e., clk1/ce1B), and the first port input clock signal (i.e., A_inclk). An operation 1411 is provided for using the second port input clock signal to control input registers of a second port (Port B) of the memory block.

The method also includes an operation 1413 for selecting a second port core clock signal from a group consisting of the second clock signal (i.e., clk1/vcc), the second clock signal tied to the third clock enable signal (i.e., clk1/ce1), the second clock signal tied to the fourth clock enable signal (i.e., clk1/ce1B), and the first port core clock signal (i.e., A_inclk_core). An operation 1415 is provided for using the second port core clock signal to control the core of the memory block during processing of instructions received through the second port (Port B). It should be appreciated that the first port input clock signal, the first port core clock signal, the second port input clock signal, and the second port core clock signal are selected by setting configuration bits in a configuration memory of the programmable logic device.

In one embodiment, the memory block clock configuration logic described herein may be implemented in conjunction with the TriMatrix embedded memory blocks within the Stratix II, Stratix II GX, or Cyclone II FPGA devices, of Altera Corporation. However, it should be understood that the memory block clock configuration logic described herein may also be implemented in conjunction with programmable logic device architectures other than the Stratix II, Stratix II GX, and Cyclone II devices, or in conjunction with devices that do not specifically include TriMatrix embedded memory blocks.

The programmable logic device including the above-described memory block clock configuration logic may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any other suitable application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. Integrated circuit storing clock configuration logic for a memory block, the logic comprising:
    a first set of clock configuration logic configurable to provide a first port input clock signal operable to control input registers of a first port of the memory block; and
    a second set of clock configuration logic configurable to provide a second port input clock signal operable to control input registers of a second port of the memory block, wherein the second set of clock configuration logic is configurable to provide a second port core clock signal for controlling the core of the memory block.

2. Integrated circuit as recited in claim 1, wherein the first set of clock configuration logic is configurable to provide a first port core clock signal operable to control a core of the memory block.

3. Integrated circuit as recited in claim 2, wherein the first port core clock signal is the same as the first port input clock signal.

4. Integrated circuit as recited in claim 1, wherein the second port core clock signal can be controlled independently from the second port input clock signal.

5. Integrated circuit as recited in claim 1, wherein the first and second sets of clock configuration logic are defined to enable a power savings mode of operation when the memory block is configured to operate in a dual port mode, the dual port mode includes the first port configured to process write operations and the second port configured to process read operations.

6. Integrated circuit as recited in claim 5, wherein the power savings mode enables the second port core clock signal to be shut off without affecting the second port input clock signal.

7. A method for controlling a memory block, comprising:
    using a first port input clock signal to control both input registers of a first port of the memory block and a core of the memory block during processing of instructions received through the first port; and
    using a second port input clock signal to control input registers of a second port of the memory block, wherein the first port input clock signal is derived from a first clock signal, and wherein the second port input clock signal is derived from a second clock signal generated independent of the first clock signal.

8. A method for controlling a memory block as recited in claim 7, further comprising:
    using a second port core clock signal to control the core of the memory block during processing of instructions received through the second port.

9. A method for controlling a memory block as recited in claim 8, wherein the second port core clock signal is derived from one of the second clock signal and the first port input clock signal.

10. Integrated circuit storing clock configuration logic for a memory block, the logic comprising:
    a first set of clock configuration logic configurable to provide a first port input clock signal operable to control input registers of a first port of the memory block, the first set of clock configuration logic also configurable to provide a first port core clock signal operable to control a core of the memory block, wherein the first port core clock signal can be controlled independently from the first port input clock signal; and
    a second set of clock configuration logic configurable to provide a second port input clock signal for controlling input registers of a second port of the second port of the memory block, the second set of clock configuration logic also configurable to provide a second port core clock signal for controlling the core of the memory block.

11. Integrated circuit as recited in claim 10, wherein the second port core clock signal can be controlled independently from the second port input clock signal.

12. A method for configuring clock signals to control a memory block, comprising:
    selecting a first port input clock signal from a group consisting of a first clock signal, the first clock signal tied to a first clock enable signal, and the first clock signal tied to a second clock enable signal;
    using the first port input clock signal to control input registers of a first port of the memory block; and
    selecting a first port core clock signal from a group consisting of the first clock signal, the first clock signal tied to the first clock enable signal, and the first clock signal tied to the second clock enable signal.

13. A method for configuring clock signals to control a memory block as recited in claim 12, comprising:
    using the first port core clock signal to control the core of the memory block during processing of instructions received through the first port.

14. A method for configuring clock signals to control a memory block as recited in claim 13, further comprising:

selecting a second port input clock signal from a group consisting of a second clock signal, the second clock signal tied to a third clock enable signal, the second clock signal tied to a fourth clock enable signal, and the first port input clock signal; and using the second port input clock signal to control input registers of a second port of the memory block.

15. A method for configuring clock signals to control a memory block as recited in claim 14, further comprising:

selecting a second port core clock signal from a group consisting of the second clock signal, the second clock signal tied to the third clock enable signal, the second clock signal tied to the fourth clock enable signal, and the first port core clock signal; and using the second port core clock signal to control the core of the memory block during processing of instructions received through the second port.

16. A method for configuring clock signals to control a memory block in a programmable logic device as recited in claim 15, wherein the first port input clock signal, the first port core clock signal, the second port input clock signal, and the second port core clock signal are selected by setting configuration bits in a configuration memory of a programmable logic device.

* * * * *